(12) United States Patent
Kajiwara et al.

(10) Patent No.: US 6,798,072 B2
(45) Date of Patent: Sep. 28, 2004

(54) FLIP CHIP ASSEMBLY STRUCTURE FOR SEMICONDUCTOR DEVICE AND METHOD OF ASSEMBLING THEREFOR

(75) Inventors: Ryoichi Kajiwara, Hitachi (JP); Masahiro Koizumi, Hitachi (JP); Toshiaki Morita, Hitachi (JP); Kazuya Takahashi, Hitachinaka (JP); Asao Nishimura, Kokubunji (JP); Masayoshi Shinoda, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 110 days.

(21) Appl. No.: 09/793,439

(22) Filed: Feb. 27, 2001

(65) Prior Publication Data

US 2002/0056906 A1 May 16, 2002

(30) Foreign Application Priority Data

Nov. 10, 2000 (JP) ........................................ 2000-349304

(51) Int. Cl.$^7$ .......................... H01L 23/48; H01L 23/52
(52) U.S. Cl. ...................... 257/778; 257/737; 257/738; 257/773; 438/108; 438/613
(58) Field of Search ................................. 257/778, 737, 257/738, 772, 773, 775, 747, 787, 788, 779, 748, 782, 783; 438/108, 613

(56) References Cited

U.S. PATENT DOCUMENTS 5,901,050 A * 5/1999 Imai ............................ 361/820

| 6,097,089 | A | * | 8/2000 | Gaku et al. ................. 257/712 |
|---|---|---|---|---|
| 6,132,543 | A | * | 10/2000 | Mohri et al. ............. 156/89.12 |
| 6,168,859 | B1 | * | 1/2001 | Mills et al. .................. 428/329 |
| 6,249,051 | B1 | * | 6/2001 | Chang et al. ................ 257/737 |
| 6,376,100 | B1 | * | 4/2002 | Shiobara et al. ............ 428/620 |
| 6,437,450 | B1 | * | 8/2002 | Baba et al. .................. 257/778 |

FOREIGN PATENT DOCUMENTS

| JP | 228946 | | 1/1990 |
|---|---|---|---|
| JP | 6-188530 | * | 7/1994 |
| JP | 831870 | | 2/1996 |
| JP | 888250 | | 4/1996 |
| JP | 8222600 | | 8/1996 |
| JP | 9102514 | | 4/1997 |
| JP | 1050758 | | 2/1998 |
| JP | 10107078 | | 4/1998 |
| JP | 1126511 | | 1/1999 |
| JP | 11026922 | | 1/1999 |
| JP | 114431 | | 4/2000 |
| JP | 286297 | | 10/2000 |

* cited by examiner

Primary Examiner—Long Pham
Assistant Examiner—DiLinh Nguyen
(74) Attorney, Agent, or Firm—Antonelli, Terry, Stout & Kraus, LLP

(57) ABSTRACT

A semiconductor device includes a semiconductor chip and a printed circuit board. Metal electrodes of the semiconductor chip and the internal connection terminals of the printed circuit board are electrically connected through the metallic joining via precious metal bumps. A melting point of a metal material constituting each of the metallic joining parts is equal to or higher than 275 degrees, and a space defined between the chip and the board is filled with resin (under fill) containing 50 vol % or more inorganic fillers.

12 Claims, 15 Drawing Sheets

CRUSHED HEIGHT LEVEL DURING JOINING

FLIP CHIP ASSEMBLY STRUCTURE FOR SEMICONDUCTOR DEVICE AND METHOD OF ASSEMBLING THEREFOR

BACKGROUND OF THE INVENTION

1. Field of the Invention

The present invention relates to flip chip assembly structure for a semiconductor chip in which each of precious metal bumps is employed as a material for electrical connection.

2. Description of the Related Art

As for the conventional flip chip assembly method employing Au bumps, 1) the assembly method wherein insulating resin is applied to an insulating board, the position of the insulating board is made align with the position of a semiconductor element, the load is applied to make the projection electrodes of the semiconductor element contact the conductor wiring of the insulating board and also then the insulating resin is cured to carry out the connection is described in JP-A-2-28946, and 2) the assembly method wherein the heating is carried out through an anisotropic conductive adhesive and also both of the pressure and the ultrasonic wave are applied to connect bumps which are formed on a chip and electrodes of a board to each other is described in JP-A-11-26922. In addition, 3) the assembly method wherein bumps which are formed on a chip and connection parts of a board are connected to each other by the heating and the application of the pressure while applying thereto the ultrasonic wave is described in JP-A-10-107078.

SUMMARY OF THE INVENTION

In the light of the foregoing, the present invention has been made in order to solve the above-mentioned problems associated with the prior art, and it is therefore an object of the present invention to provide, in assembly structure in which a chip is mounted to a printed circuit board in a face down manner, flip chip assembly structure in which the temperature cycle reliability and the electrical characteristics of the electrical connection parts are excellent.

In addition, It is another object of the present invention to provide, in a method of flip-chip mounting a semiconductor chip having a plurality of precious metal bumps formed thereon to a printed circuit board, a flip chip assembly method, having high productivity and high joining reliability, wherein the metal joining between precious metal bumps and internal connection terminals of a printed circuit board, and filling a space defined between the chip and the board with resin can be carried out in one process, electrical resistances of the connection parts can be reduced, and the under fill filling which is void free can be made using resin having a high filler containing rate.

In the assembly structure by the conventional assembly method 1), it is difficult due to the problem such as the heat resistance or the like of the under fill resin to increase the heating temperature so that the metallic joining between the bumps and the pads (in the present specification, the joining at the atom level is referred to as the metal joining) is not achieved. In addition, since resin is left on the interface, the contact resistance becomes considerably large and is in the range of several tens to one hundred and several tens mΩ. In the future, a semiconductor chip has a tendency in which the low voltage driving will advance more and more. In such a case, if the connection resistance is large, then it becomes difficult to operate normally the circuits on the chip. In addition, the loss due to the resistances in the connection parts is large, and hence it becomes a problem in terms of the power consumption. Also, if resin draws the moisture to expand under the environment of the high temperature and the high humidity, then the resistance is increased, and in the extreme case, the malconduction is caused. This becomes a problem in terms of the reliability as well.

In the assembly structure by the conventional assembly method 2), since the electrical conduction is ensured on the basis of the contact between the electrically conductive particles, there arises a problem that it is difficult to achieve the metal joining and hence the electrical resistance in each of the connection parts is large. In addition, when each of the bumps becomes minute, the number of electrically conductive particles which are caught fluctuates, and hence there is the possibility that the electrical characteristics of the connection parts become unstable.

In addition, in the assembly structure by the conventional assembly method 3), since while the metal joining is achieved, in this method, resin is not previously filled into the space defined between the chip and the board, there is adopted the process wherein after completion of the metal joining, liquid resin is led into that space by utilizing the capillary phenomenon to fill the under fill. In the assembly structure by this method, when the chip area becomes large or when the gap defined between the chip and the board becomes small, there arises a problem that the air layer is left due to the fact that the speed at which the resin flows thereinto differs depending on the places so that the void defects may be easy to be generated. In addition, in the extreme case, it may be difficult to fill resin in itself therein in some cases. In particular, this problem becomes more remarkable as the containing rate of inorganic fillers becomes higher which is mixed therewith in order to reduce the coefficient of thermal expansion.

By the way, by the void discussed herein is meant the void having the size (the diameter is about 30 $\mu$m) in which the force which is caused by the volume expansion (cubical expansion) ($1.2 \times 10^3$ times) when water is changed from liquid to gas and which serves to expand the space defined between the chip and the board exceeds $\frac{1}{10}$ (1 g) of the level at which one bump joining part is peeled off.

According to one aspect of the present invention, there is provided flip chip assembly structure including: a semiconductor chip having a circuit for processing electrical signals; electrodes which are provided on the semiconductor chip; bumps which are respectively formed on the electrodes; internal connection terminals through which the electrical signal is fetched from the associated ones of the electrodes via the associated ones of the bumps; and a printed circuit board on which the internal connection terminals are provided, wherein a semi-cured resin sheet which is softened by the heating is inserted into the space defined between the semiconductor chip and the printed circuit board, and the load is applied thereto, the heating is carried out and the ultrasonic wave vibration is applied so that the bumps and the internal connection terminals are metallically joined to each other.

It is desirable that each of the bumps is made of precious metal. In particular, Au is desirably employed therefor.

In addition, it is preferable that the melting point of a metal material of which each of the metallically joined connection parts is made is equal to or higher than 270° C. The present invention may provide that the resin sheet which is inserted into the space defined between the semiconductor chip and the printed circuit board contains 50 vol % or more inorganic fillers.

In addition, the metallic electrodes of the semiconductor chip and the internal connection terminals of the printed circuit board are electrically connected to each other through the precious metal bumps by the metal joining; the melting point of a metal material of which each of the connection parts is made is equal to or higher than 275° C.; the resin (under fill) containing 50 vol % or more inorganic fillers is led into the space defined between the chip and the board; resin is formed in such a way as to become void-free; and the fluctuation, of the containing rate of inorganic fillers contained in resin, which is dependent of the places is made equal to or lower than 10% or less (with respect to the definition of the fluctuation, the fluctuation of the filler containing rate is obtained by cutting out resin of 1 millimeters square from an arbitrary place within the chip surface, and the value which is obtained by dividing the difference between the maximum value and the minimum value thus obtained from that fluctuation by the mean containing rate is expressed in the form of the fluctuation rate).

In addition, according to the present invention, there is provided a method wherein projection bumps, made of precious metal, each of which has a projection type shape are respectively formed on electrodes of a semiconductor chip; precious metal is formed on the surfaces of internal connection terminals of a printed circuit board; a thermosetting resin sheet which has been semi-cured by mixing therewith fine inorganic fillers is attached to a predetermined position of the printed circuit board; the printed circuit board is set on a heat stage; the chip is mounted thereto in a face down manner with the bumps and the internal connection terminals aligned with each other; a heated joining tool for applying the ultrasonic wave and the load is pressed against the chip from the upper side by a predetermined force; and after the precious metal bumps have been buried in the resin sheet, which was softened by the heating, to come into contact with the connection pads, respectively, the precious metal bumps are crushed to be metallically joined to the pads, respectively, while pushing out a part of the resin sheet from the part between the chip and the board to the outside by applying thereto the ultrasonic wave vibration.

According to this method, since the bonding is carried out while pushing out a part of resin from the part between the chip and the board, the generation of the voids each having a size equal to or larger than the space defined between the chip and the board can be prevented with the probability of 100%. Further, if even when the filler containing rate is high, this rate falls within the range in which the sheet can be produced, the space defined between the chip and the board is filled with the fillers with the fillers uniformly dispersed in that space. Thus, the assembly in which the filling quality of organic resin is fixed becomes possible. In this method, since resin which is excellent in the thermal stability and the hygroscopic property can be used irrespective of the fluidity, there are offered the advantages that the high temperature stability of resin after completion of the curing processing by the baking can be enhanced, and also the problem of the corrosion or the like under the high temperature and high humidity environment due to the material generated through the thermal decomposition of resin, and the problem of the degradation of resin due to the hydrolysis can be reduced.

On the other hand, in the method employing that resin sheet, since resin lies between the bumps and the terminals, there is the possibility that a problem arises in the joining between the bumps and the pads. In actual, the metallic joining can not be achieved due to the remaining thin resin layer by the compression joining which is simply based on the heating and the application of the pressure. For this reason, there arise a problem that the contact resistance of the connection part is increased up to several tens to several hundreds mΩ, and a problem that the breaking of wire(s) is easy to occur due to the long term change, the expansion change resulting from the moisture drawing and the like of resin. Then, in the present invention, in order to achieve the metallic joining, there has been desired a method utilizing the ultrasonic wave vibration provided by a novel joining machine. As a result, resin can be exhausted from the composition interfaces between the bumps and the internal connection terminals to achieve the metallic joining. The details of the connection machine will be described later.

While in the above description, the specific case where each of the pad surfaces on the board side is made of the precious metal film has been described, even when each of the pad surfaces on the board side is made of a low-melting point film, by adopting the same assembly method, the under fill which has the high filter filling rate and the high molecular weight can be filled in the space defined between the chip and the board in the void free manner and also the connection part having a low resistance and high temperature reliability can be realized. The reason that the high temperature reliability of the joining parts can be enhanced is that in the ultrasonic wave flip chip joining process, low-melting metal or an eutectic alloy which has been melted can be exhausted from the composition interfaces to provide the structure in which the joining is carried out using only high-melting point metal or a high-melting point alloy.

As has been described in detail, according to the present invention, it is possible to provide flip chip assembly structure in which the electrical connection parts are excellent in the heat resistance and the electrical characteristics.

BRIEF DESCRIPTION OF THE DRAWINGS

The above and other objects as well as advantages of the present invention will become clear by the following description of the preferred embodiments of the present invention with reference to the accompanying drawings, wherein.

DETAILED DESCRIPTION OF THE EMBODIMENTS

The preferred embodiments of the present invention will hereinafter be described in detail with reference to the accompanying drawings.

(First Embodiment)

Figure 1:
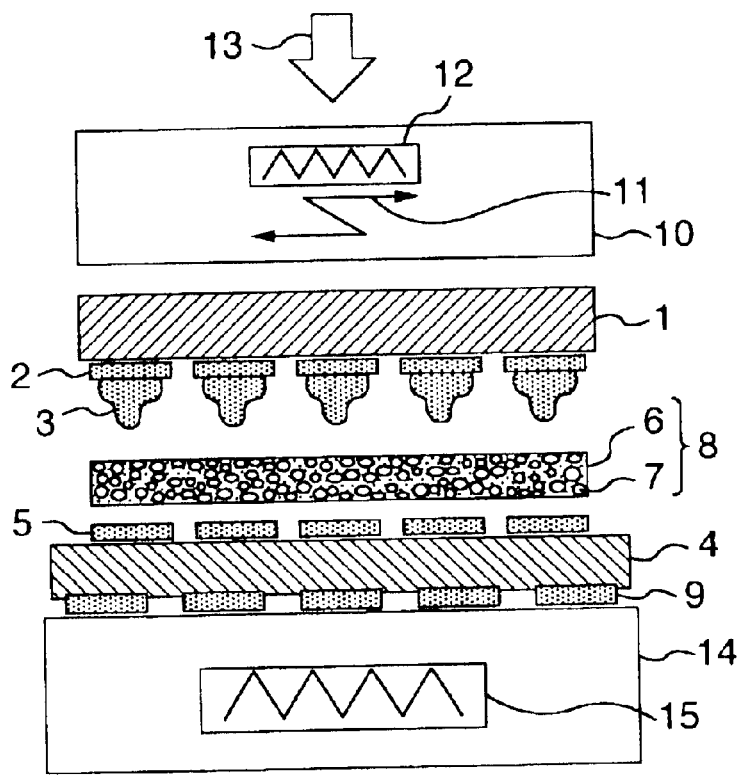
FIG. 1 is a schematic view useful in explaining an embodiment of a flip chip assembling method according to the present invention.

FIG. 1 shows the construction of joining members and the periphery of the joining members in assembling a flip chip using the ultrasonic wave according to the present invention. In the figure, Au bumps 3 are respectively formed on electrodes 2 of a semiconductor chip 1. The Au bumps are formed by utilizing the ball bonding method. Each of them has two-steps projection type shape in which the height there of is increased as the position thereon is nearer the center of the bump and is formed in such a way that the diameter is 100 $\mu$m, the head height is 100 $\mu$m, the shoulder height of the first step (on the side of the semiconductor chip 1) is 30 $\mu$m and the diameter of the second step (on the side of an organic printed circuit board 4) is 40 $\mu$m. On the other hand, after the surfaces of internal connection terminals 5 containing Cu as the basic constituent have been plated with Ni, an Au plated film with 0.7 $\mu$m thickness is formed thereon. External connection terminals 9 for the connection to other chip, substrate or the like are formed on the rear face of the organic printed circuit board 4. A resin sheet 8 which is obtained in such a way that thermosetting resin 6 containing epoxy resin as the main constituent is mixed with 50% insulating inorganic fillers ($SiO_2$ corpuscle) having a lower thermal expansion coefficient than that of the thermosetting resin 6 and then the semi-curing processing is carried out for the resultant member is inserted into the space defined between the chip and the board. For the size of the $SiO_2$ inorganic filler, the mean particle size is about 2 $\mu$m and the maximum value thereof is set equal to or smaller than 7 $\mu$m. The sheet thickness at this time is set to 50 $\mu$m which is about 1.2 times as large as the final bump height. These works are laminated in the order of the board, the resin sheet and the semiconductor chip from the side of a heat stage 14, and then a joining tool 10 is arranged in order to apply the pressure to them from the upper side. The joining between the chip and the board is achieved on the basis of ultrasonic wave vibration 11, a load 13 and heating from the tool 10. The heating of the chip and the board is carried out by heaters 12 and 15, respectively.

In other words, the flip chip assembly structure of the present invention includes the semiconductor chip having a circuit for processing the electrical signals, and the semiconductor chip is provided with the electrodes on which the bumps are in turn formed, respectively. The internal connection terminals through which the electrical signal is fetched from the associated ones of the electrodes via the associated ones of the bumps are provided on the printed circuit board. The semi-cured resin sheet which is softened by the heating is inserted into the space defined between the semiconductor chip and the printed circuit board, the load is applied thereto, the heating is carried out therefor and the ultrasonic wave vibration is applied thereto, whereby the above-mentioned bumps and the above-mentioned internal connection terminals are metallically joined to each other. In addition, each of the bumps is made of precious metal, e.g., Au.

Figure 2:
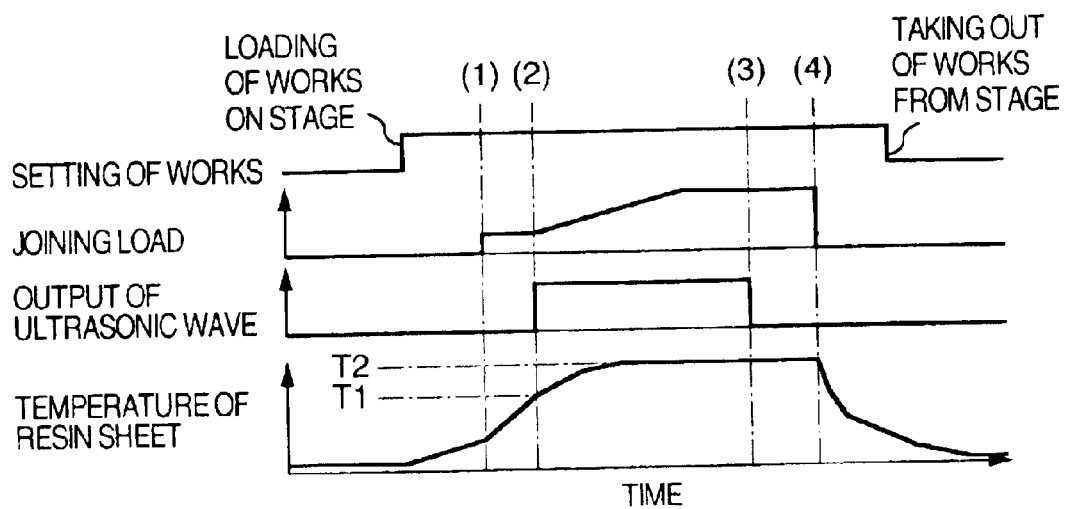
FIG. 2 is a schematic view useful in explaining an embodiment of a time chart of the flip chip assembling method according to the present invention.
Figure 3:
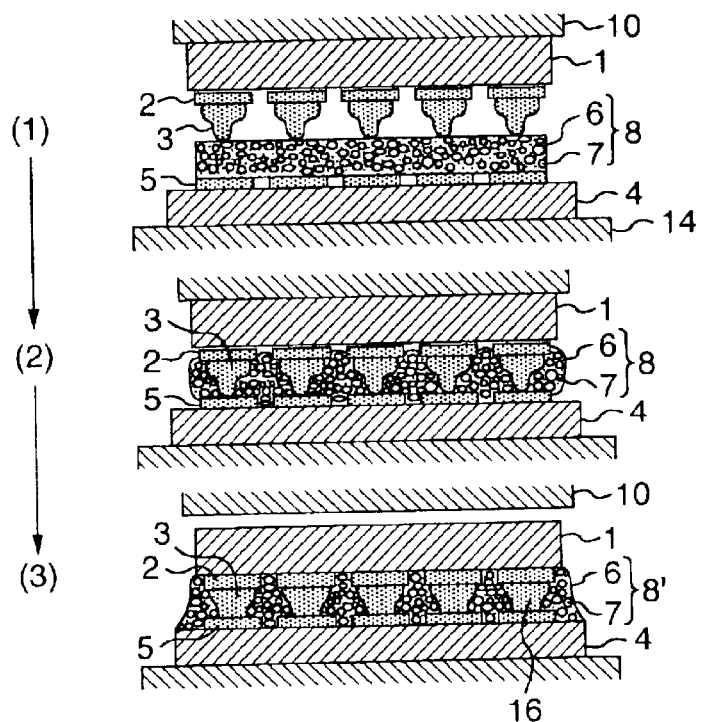
FIG. 3 is a schematic view useful in explaining the joining progress process of the flip chip assembling method according to the present invention.

Next, FIG. 2 shows a time chart useful in explaining the joining process, and FIG. 3 shows cross sectional views showing the structure of the joining part at respective time points in the time chart shown in FIG. 2. In the joining process, first of all, the works are laminated and loaded on the heat stage, which is heated at a temperature of 150° C., while aligning these works with the heat stage, and then immediately, the joining tool which is being heated at 150° C. is made descend to apply a light weight to the chip. The value of the load is set to 15 g/bump. The situation of the joining part at a time point (1) is shown in a part (1) of FIG. 3. Since the resin sheet 8 is still in the solid state, the Au bumps 3 are in the state of getting on the resin sheet 8. Referring back to FIG. 2, after the time point of the part (1) of FIG. 2, the resin sheet 8 starts to be heated on the basis of the heat condition from both of the board side and the chip side. Then, the temperature rapidly rises so that the resin sheet 8 starts to be softened. The situation of the joining part at a time point when the temperature of the resin sheet 8 has reached a softening temperature T1 is shown in a part (2) of FIG. 3. Then, there is provided the state in which the projection-shaped Au bumps 3 enter into the resin sheet until the heads thereof come into contact with the surfaces of the internal connection terminals 5. After the time point of the part (2), the load is increased up to 100 g/bump while applying the ultrasonic wave vibration to the joining tool to join metallically the Au bumps 3 to the internal connection terminals 5 which were plated with Au. Since the resin sheet contains the less volatile components and also a part of the resin sheet is exhausted from the interfaces between the internal connection terminals 5 and the Au bumps 3 when the temperature is low before the progress of the bonding, the organic contamination of the surfaces to be joined due to the resin sheet 8 does not become so heavy as to impede the joining property. For this reason, the metallic joining at the level of obtaining the excellent electrical condition is achieved. The softening temperature of the resin sheet is the important factor in relation to the joining temperature. The proper range of the softening temperature in the present invention is desirably equal to or lower than 200° C. from a viewpoint of not increasing the joining temperature, and while not in the strict sense of the words, is desirably equal to or higher than 70° C. from the fact that in the joining process, the temperature needs to reach the softening temperature after having applied the pressure thereto. In the present embodiment, the resin sheet at 100° C. is employed. The vibration amplitude of the ultrasonic wave is desirable in the range of 1 to 6 $\mu$m at the head of the joining tool. In the present embodiment, the vibration amplitude of the ultrasonic wave us set to 3 $\mu$m. Also, the time period for which the ultrasonic wave is being applied is desirable in the range of 50 to 500 ms. In the present embodiment, it is set to 300 ms. The load which is applied by the joining tool is held for a time period when the application of the ultrasonic wave is stopped to cure temporarily the resin (about 5 seconds in the present embodiment) and then is released. Thereafter, the works are moved from the ultrasonic wave joining position. On the other hand, the heating is continued to be maintained for 30 minutes to cure perfectly the resin and then the works are cooled down to the room temperature. The state of the joining part at a time point (4) when the load is released is shown in a part (3) of FIG. 3. The heads of the Au bumps 3 are crushed to be respectively joined to the internal connection terminals 5. The Au bumps 3 are partially metallically joined to the composition interfaces 16 in the state in which the resin 6 and the fillers 7 do not lie therebetween. The joining conditions are selected in such a way that the space defined between the chip 1 and the printed circuit board 4 becomes 40+15 $\mu$m when the initial bump size is the value shown in FIG. 1. With respect to the compression joining bump shape in this case, the diameter in the first step on the chip side is 100 $\mu$m which is equal to the initial value, and the diameter in the second step on the board side is increased up to 50 $\mu$m because of the crushing. Thus, after completion of the compression joining, the two-steps shape is still left as it is. The space defined between the chip and the board is filled with a under fill 8', which contains, as the basic constituent, epoxy resin 26 containing a silica filler 27 with 2 $\mu$m mean particle size, in the void free state. While the electrodes of the semiconductor chip are arranged in the periphery of the semiconductor chip or are arranged in the area-like pattern on the whole surface of the semiconductor chip, in any case, the same cross sectional structure is obtained. But, the wiring pattern of the board differs greatly therebetween due to the relation of the arrangement to the external connection terminals on the rear face of the board. The minimum size of the board can be made the same as that of the semiconductor chip. In addition, while $SiO_2$ particles are employed for the inorganic fillers, alternatively, $Al_2O_3$ particles or other insulating particles may also be employed.

Now, the description will hereinbelow be given with respect to a joining machine for implementing the assembly method of the present invention. From the reasons as will be described below, the conventional ultrasonic joining machine for assembling semiconductor chips does not have the machine which is capable of heating the horn of the ultrasonic wave oscillation system and the joining tool and also does not have the machine which is capable of joining the semiconductor chips using the ultrasonic wave by applying the heavy load exceeding 5 kg. First of all, the causes that the ultrasonic wave horn of the ultrasonic wave oscillation system and the joining tool can not be heated by the conventional machine are due to the following reasons.

1) The heat resistance of the vibrator is low and in addition thereto, it is difficult to insulate thermally the vibrator and the horn from each other due to the construction in which the vibrator and the horn are directly coupled to each other.

2) When the temperature is changed, the resonance frequency is also changed so that the stable ultrasonic wave oscillation can not be obtained. From the foregoing, since in the conventional machine, the heating is forced to be carried out from the side of the board loaded on the heating stage, there arise problems that the board temperature becomes higher than the chip temperature, a large strain is generated in the joining part due to the contraction of the board showing the large thermal expansion in the cooling process after completion of the joining, and hence the disconnection failure is easy to occur.

Next, the reason that the conventional machine does not have the machine which is capable of joining the semiconductor chips using the ultrasonic wave by applying the heavy load is that it is difficult from the following reasons to design the construction of the vibration system for oscillating stably under the heavy load condition:

1) If the high rigidity is adopted, then the cross section of the horn is increased so that the complicated vibration modes other than the vibration direction which is effective to the joining are generated.

2) If the cross section of the horn is decreased to provide the low rigidity, then the resonance frequency is changed due to the deformation caused by the application of the load so that the stable oscillation can not be obtained. For this reason, in actual, there is only the example in which a small ferroelectrics chip of several millimeters square size on which several to more than ten Au bumps are formed is joined to a ceramic substrate which shows the small thermal expansion and does not have any of the resin sheets.

In order to solve the above-mentioned problems, we have developed a ultrasonic wave oscillating mechanism, as will be described later, which has a heating function and has a special horn shape, and at the same time, by reducing the ultrasonic wave frequency from the conventional 60 kHz to 50 kHz, has developed a joining machine which is capable of oscillating stably the ultrasonic wave under the condition of the high temperature heating and the application of the heavy load. Now, this joining machine will hereinbelow be described. For the flip chip joining of the chip, it is required that the bumps which are formed on the chip are greatly deformed to absorb the warpage of the board and the dispersion of the bump heights to join reliably all of the points. For this reason, when the organic board is an object, if the crushing amount of normal bumps is estimated to be about several tens $\mu$m, giving the chip the inclination in the process of crushing the bumps becomes the cause of the dispersion at the joining quality level. For this reason, the joining tool needs to have the construction in which it can descend while holding the balancing. Then, in the machine of the present embodiment, there is adopted the construction in which the strength member taking charge of the load shows a symmetry between the left and right halves, and the pressure application driving system and the central axis of the joining tool for pushing the joining member are arranged on the symmetrical axis. As a result, even when the joining load is increased, the surface of the joining tool can hold the balancing at all times.

Next, the description will hereinbelow be given with respect to the construction for heating the joining tool. Since the joining tool itself for applying the ultrasonic wave vibration and the load to the works has the small volume and hence has the small thermal capacity, it is easy to suffer the thermal fluctuation of the works. Therefore, the structure in which the main body of the ultrasonic wave horn having the large volume is heated is adopted to ensure the stability of the temperature, and in order to prevent the thermal damage of the ultrasonic wave vibrator, a radiating component which is excellent in the ultrasonic wave transmission characteristics is inserted between the ultrasonic wave vibrator and the ultrasonic wave horn while there is the possibility that the transmission loss of the ultrasonic wave is increased to fluctuate, the vibrator is made oscillate with the input to the vibrator made large to compensate for the increase of the transmission loss and to reduce the influence of the fluctuation.

If the heating temperature of the ultrasonic wave horn is changed, then the speed of sound of the member is also changed so that the resonance frequency is changed and in the extreme case, the oscillation can not be obtained. For this reason, in the present machine thus developed, the ultrasonic wave horns which are different in size for the joining temperatures are prepared. The temperature range which can be covered by one ultrasonic wave horn, while being different in the ultrasonic wave frequency and the horn shape, is set to $\pm 30°$ C. in the present embodiment.

Next, the description will hereinbelow be given with respect to the shape of the ultrasonic wave horn which can oscillate stably under the heavy load. The ultrasonic wave horn, in order to maintain the balancing of the joining tool, is processed into the shape which shows a symmetry between the left and right halves, and is held to the load application member at the left and right node points. For this reason, the horn is supported at the both ends thereof and hence suffers the bending deformation of the edge of the central load. If the rigidity of the horn is low, then the amount of bending deformation becomes large, and the horn shows an a symmetry between the upper and lower halves to generate the vibration modes other than the axial direction of the horn. As a result, if the oscillation becomes unstable and at the same time, if the vertical vibration is generated, then the joining property becomes poor. On the other hand, if the cross sectional area of the horn is increased in order to increase the rigidity, then the vibration within the surface does not become uniform and hence the complicated vibration modes are generated so that the oscillation becomes unstable and at the same time, the reduction of the joining property is invited. For this reason, in the present machine, there is adopted the construction in which the vertical board thickness which has a large influence on the flexural rigidity is increased, and the slit(s) is(are) provided in the horn in order to reduce the cross sectional area. Since the cross section of the horn is vertically divided by the effect of the slit(s), the substantial cross section in the direction along which the vibration is transmitted becomes small so that the vibration modes can be simplified and also the deformation can be suppressed due to the large thickness of the horn which has an influence on the flexural rigidity, which enables the oscillation of the ultrasonic wave to be stably carried out. In addition, in the present machine, the frequency of the ultrasonic wave is reduced from the conventional 60 kHz to 50 kHz so that the coefficient of fluctuation in the resonance point is reduced against the change in the temperature and the strain of the horn, thereby realizing the stable oscillation of the ultrasonic wave.

Figure 4:
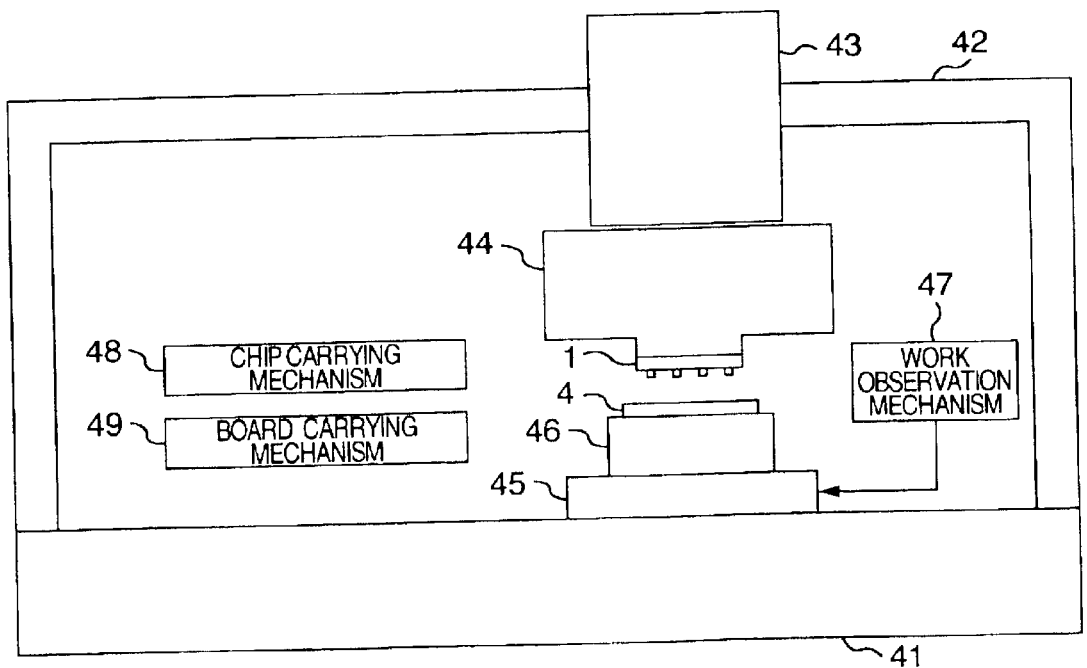
FIG. 4 is a schematic view showing an embodiment of a joining machine for implementing the flip chip assembly method according to the present invention.

FIG. 4 shows the joining machine which is employed in the present embodiment. In the figure, the machine body includes: a supporting frame 41; a supporting chassis 42; a pressure applying mechanism 43; a mechanism 44 for heating a chip and for oscillating a ultrasonic wave; a board heating mechanism 46; an alignment driving mechanism 45; a work observing mechanism 47; a board carrying mechanism 49; and a chip carrying mechanism 48. The work observation mechanism 47 has the function of taking in the vertical image through an optical mechanism inserted into the space defined between the printed circuit board 4 and the semiconductor chip 1 to detect the positional misalignment. On the basis of this information, the adjustment is carried out in the position alignment driving mechanism.

Figure 5:
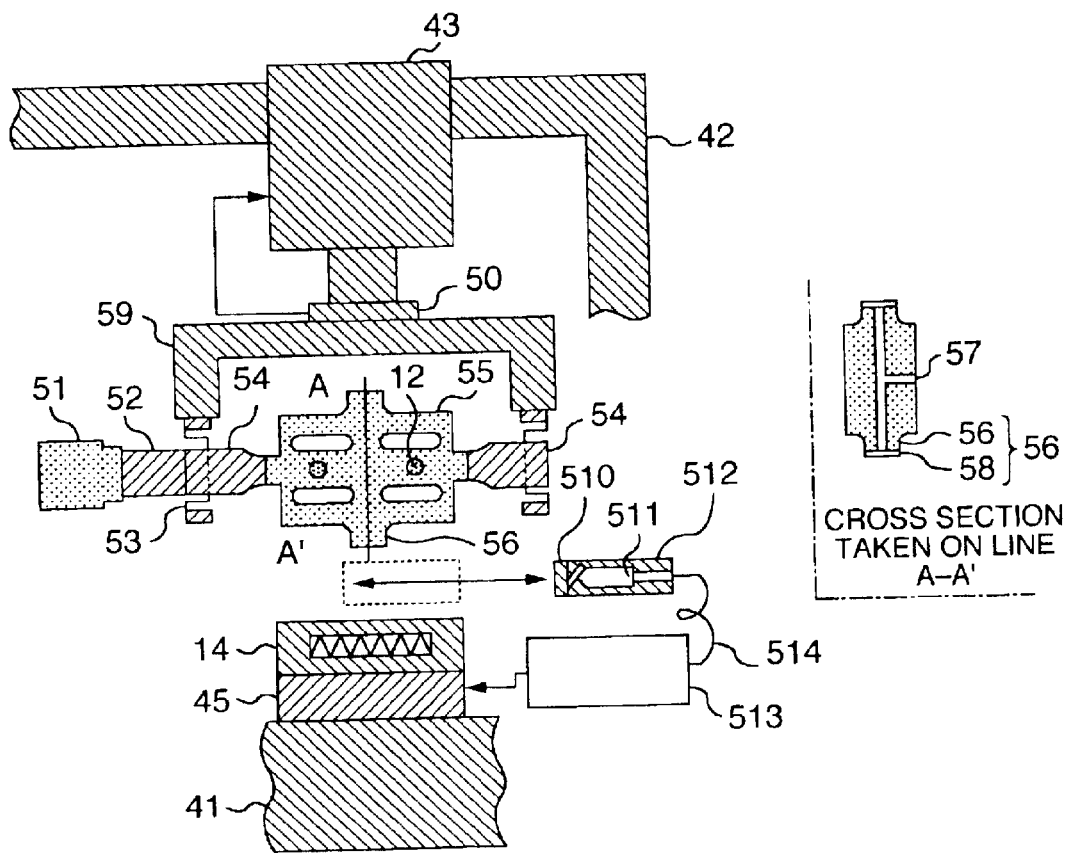
FIG. 5 is a schematic view showing an embodiment of the detailed construction of the flip chip joining machine according to the present invention.

FIG. 5 shows the detailed construction of the machine shown in FIG. 4. The pressure applying mechanism 43 adopts the serve motor driving system for detecting an output from a pressure sensor 50 to adjust automatically the current value to the setting value. A ultrasonic wave vibrator 51 is coupled to a ultrasonic wave horn 55 through a vibration amplifying component 54 having a radiating component 52 and a flange mechanism 53. The ultrasonic wave horn 55 is formed integrally with a joining tool 56. The heaters 12 are mounted to the ultrasonic wave horn 55 in the positions which are located at the vertical centers and which shows a symmetry between the left and right halves. The device is carried out in such a way that through holes (slits) are provided in the positions which shows a point symmetry with respect to the center of the ultrasonic wave horn 55 and hence the vibration mode within the horn becomes a single mode corresponding to only one axial direction. In the inside of the ultrasonic wave horn is provided with a suction hole 57 for sucking the works, and a super-hard member 58 is joined to the tip of the joining tool in order to lengthen the life thereof. The ultrasonic wave vibrating mechanism is mounted to a member 59 for supporting the vibration system through a flange which is mounted to the node position of the vibration. The positional misalignment judging mechanism includes an optical head 512 consisting of a half mirror 510 and a CCD sensor 511, and a processing circuit 513 for judging the positional misalignment on the basis of the image processing. The information from the optical head 512 is transmitted to the processing circuit 513 through a cable 514. The optical head 512 includes a movable mechanism and serves to make a round trip between the joining position and the stand-by position every sample.

In accordance with the present joining machine, the device is applied to the shape of the ultrasonic wave horn, whereby the vibration mode of the ultrasonic wave horn having the high rigidity can be controlled in such a way as to be made a single mode corresponding to only one axis. Also, the load applying construction of the vibration system is made the two-points support by the flange mechanism 53, and the shape is made show a symmetry between the left and right halves for the point of application of the force of the joining tool, whereby even if the heavy load is applied to deform the vibration system, the balancing of the tool surface can be held. Therefore, it becomes possible to apply the heavy load and the excellent ultrasonic wave vibration, which is required for the joining, while maintaining the balancing of the tool for the multipin LSI chip. As a result, the precious metal bumps of the multipin LSI chip can be reliably metallically joined to the precious metal pads of the board under the low temperature condition by utilizing the ultrasonic wave energy.

Figure 6:
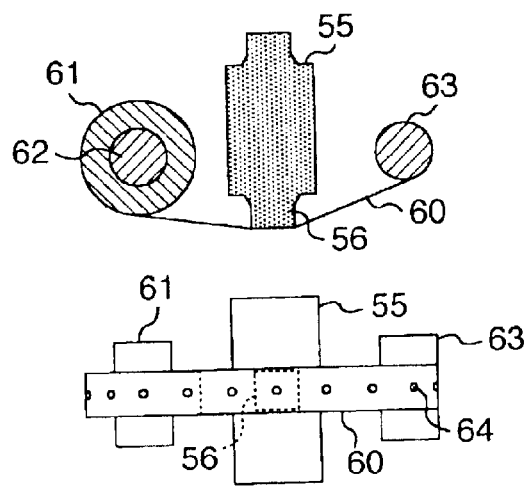
FIG. 6 is a schematic view showing an organic tape supplying mechanism of the flip chip joining machine according to the present invention.

In addition, the present joining machine, as shown in FIG. 6, has preferably a mechanism for supplying an organic tape between the joining tool and the work. In the figure, an organic tape 60 made of polyimide is arranged at the head of the joining tool 56 which is formed integrally with the ultrasonic wave horn 55. The organic tape is successively forwarded from the side of a roll 61 by take-up mechanisms 62 and 63. Thus, a new tape is supplied to the position under the tool every joining. Holes 64 for sucking the work are provided in the organic tape and the tape forwarding position is controlled in such a way that the hole is aligned with the suction hole of the tool. While the organic tape may be either thermoplastic or thermosetting, the high rigidity is required therefor in such a way that the absorption of the ultrasonic wave becomes less, and the elastic modulus is desirable in the range of 1 to 100 GPa. The elastic modulus of polyimide is about 9 GPa.

Thereby, since an organic material which is softer than the joining tool and the LSI chip can be sandwiched between the joining tool made of a super-hard material and the LSI chip, the chip surface becomes free from the damage. Therefore, since the tool also becomes free from the tool, there is offered the effect that the tool life can be lengthened. In addition, since the adhesion between the chip and the organic tape becomes excellent and the slipping becomes small, there is also offered the effect that the transmissibility of the ultrasonic wave vibration is increased and hence the joining property can be enhanced.

As the result of carrying out repeatedly the various joining experimentations using this joining machine, the following items are confirmed:

1) In the joining between the precious metal bumps and the terminals, on which the precious metal film is formed, in the state of inserting resin, resin therebetween can be forced to be exhausted to the outside to achieve the metallic joining.

2) For this reason, in the flip chip joining in the state of inserting the resin, the contact resistance of the connection part can be reduced to about 0.1 to 10 m$\Omega$.

3) The temperature on the board side is made equal to or lower than that on the chip side, whereby the generation of the thermal strain in the cooling process can be reduced, and hence the joining of the chip having a larger area and the joining of the chip to the organic board showing large thermal expansion become possible.

4) The flip chip joining of a 1,000 pin-class chip having the bumps each having the diameter of 50 to 100 $\mu$m becomes possible.

Figure 7:
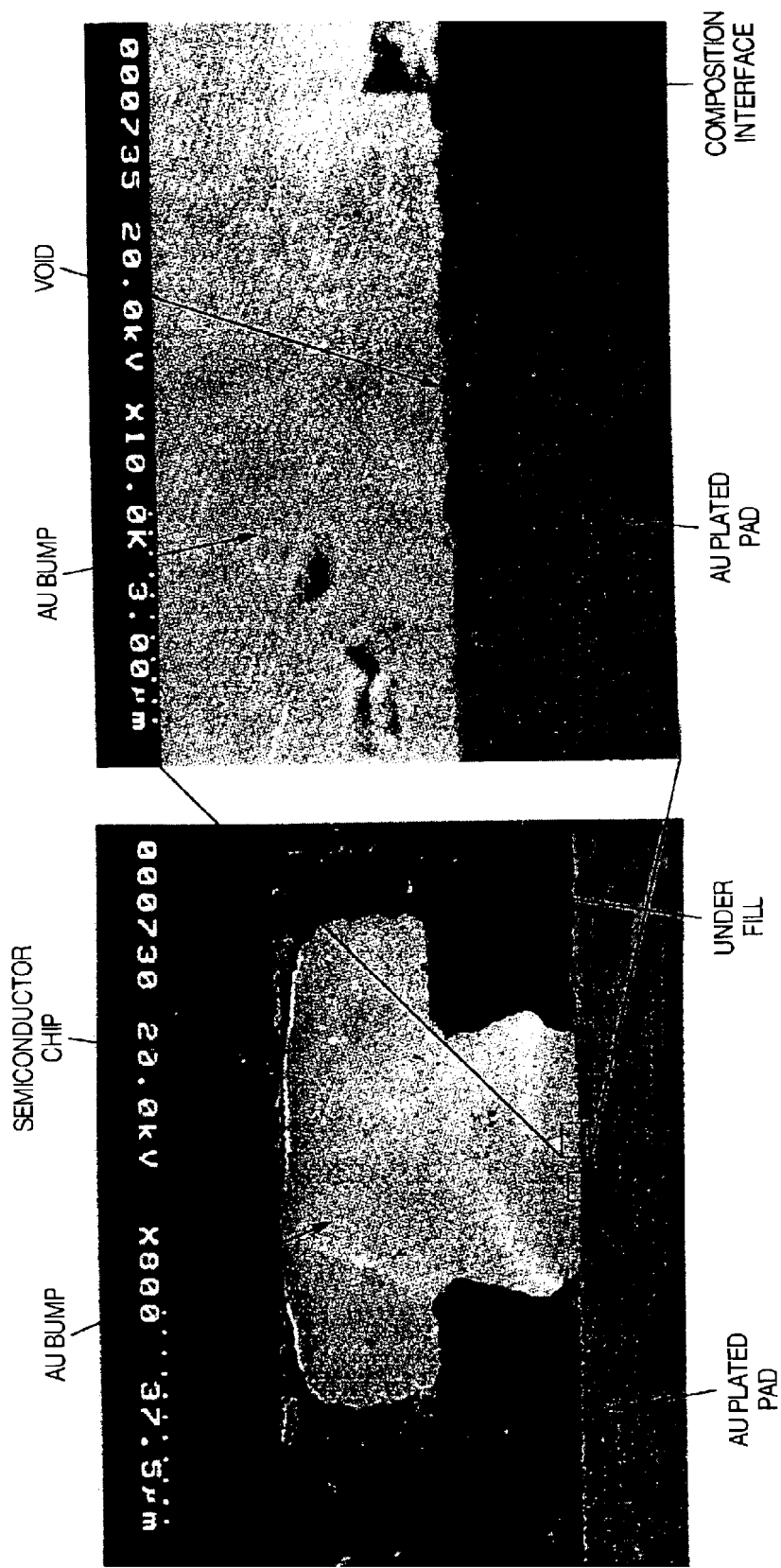
FIG. 7 is an example of a cross sectional photograph of the flip chip joining part according to the present invention.

FIG. 7 shows an example of an enlarged photograph of the bump joining part. There can be confirmed the situation in which the under fill resin is filled without any of defects and the bumps and the pads are metallically joined to each other though the void defects are present. The precious metal bumps and the precious metal pads on the board side are metallically joined to each other, whereby with respect to the electrical resistance of the connection part, the contact resistance of the composition interface can be greatly reduced. In the conventional system, in the case of the bump size of 50 to 100 $\mu$m, the resistance value is in the range of several tens to one hundred and several tens m$\Omega$, whereas in the structure according to the present invention, it becomes clear that the resistance can be reduced to the range of 0.1 to 10 m$\Omega$.

Figure 8:
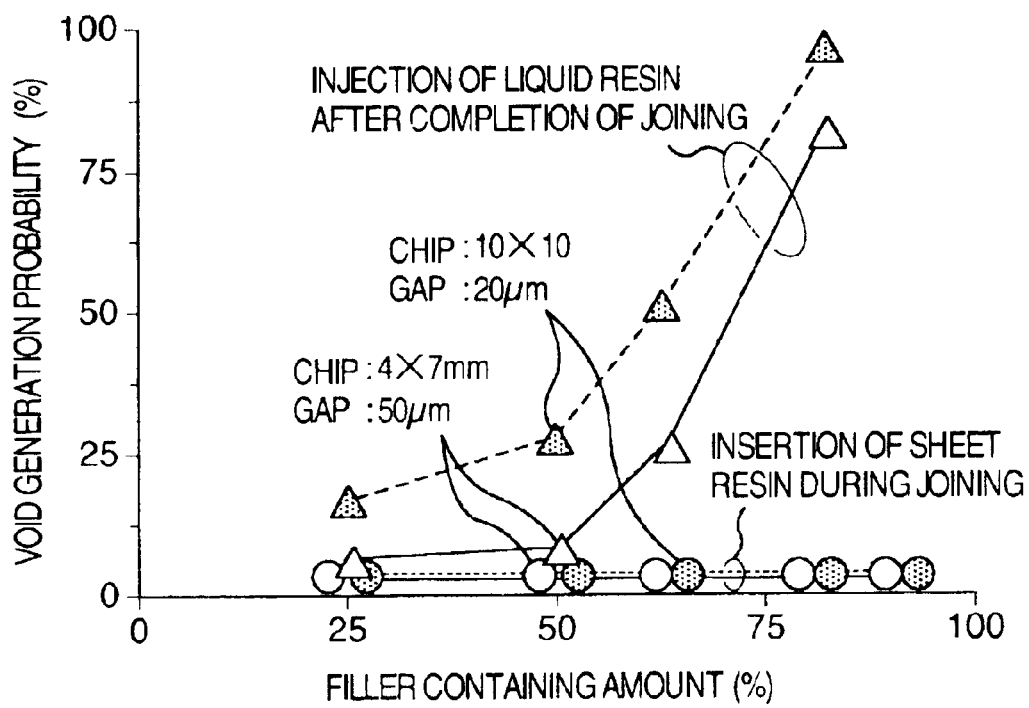
FIG. 8 is a schematic view useful in explaining the relationship between the filler containing amount and the void occurrence rate which is dependent on a space defined between a chip and a board.

According to the present invention, since there is adopted the method wherein in the state of laminating the board, the resin sheet and the chip, the heat and the ultrasonic wave vibration are applied to carry out the compression joining, the Au bumps push the softened resin away to come into contact with the Au pads on the board, respectively, and in addition thereto, the metallic joining between the bumps and the internal connection terminals is achieved by the ultrasonic wave vibration. Therefore, the flip chip assembly for the semiconductor chip including the metallic joining between the Au bumps and the Au pads, and the resin filling into the space defined between the chip and the board can be carried out in one process to enhance the productivity, the electrical resistance of the connection part can be reduced since the metallic joining between the Au bumps and the Au pads is achieved, and the assembly reliability can be enhanced since the under fill filling which is void free is possible using the resin having the high filler containing rate. Thus, it is possible to provide the flip chip assembly method which is excellent in the productivity, the electrical characteristics and the reliability. Giving the detailed description with respect to the reliability, the under fill can be formed in a void free manner, whereby the peeling-off of the joining part in the reflow due to the vaporization expansion of the moisture in the voids can be prevented from being generated. In addition, the chip and the board are firmly bonded with the under fill in which the filler containing rate is increased and the coefficient of thermal expansion thereof is made smaller than 20×10$^{-6}$/degree which is equal to that of the board, whereby the thermal strain which is caused along with the temperature change can be equally dispersed among the chip, the bumps and the board to lengthen the temperature cycle life. Further, since the Au/Au joining is metallically stable under the high temperatures, it is possible to provide the assembly structure which is excellent in the high temperature life. The thermal expansion coefficient of the under fill is preferably in the range of 10 to $25 \times 10^{-6}$/degree. FIG. 8 shows the generation rate of the voids in the under fill in the semiconductor assembly products which are manufactured in accordance with the method shown in FIGS. 1, 2 and 3. For the comparison, the results in the conventional system of injecting the liquid resin after completion of the joining are plotted. In the system of injecting the resin after completion of the assembly, if the filler containing amount is increased, then the fluidity is reduced. Also, the void generation rate is increased as the space defined between the chip and the board is smaller and the chip size is larger. In the conventional method, if the filler containing amount exceeds 50%, then it becomes difficult to remove the voids. The generation of the voids when supplying the resin from one side is the problem which arises due to the fact that the speed of the penetration of the resin by the capillary phenomenon differs depending on the places due to the presence of the bumps, and is caused by the entrainment of air. For this reason, the voids which have the size corresponding to the space defined between the chip and the board are present.

On the other hand, in the resin sheet system, in the stage of applying the pressure in the state of the solid having the low elasticity, the gases which are present in the space defined between the chip and the resin sheet and the space between the board and the resin sheet are exhausted to the outside by the pressure, and further the resin flows in the direction of being pushed out from the inside to the outside to exhaust the gases. As a result, the generation rate of large voids becomes zero. If the gases should remain in both of the spaces, the volume thereof is very small. Thus, this does not become the problem such as the occurrence of the reflow cracks resulting from the reduction of the strength or the moisture absorption. That is, the occurrence of the failure due to the void defects can be avoided perfectly. In addition, the resin having the filler containing rate of 50 vol % or more is formed between the chip and the board in the void free manner to be bonded thereto and to be cured, whereby in the conduction of the temperature equal to or lower than the curing temperature of the resin, the compressive force is applied to the Au bump joining parts at all times by the contraction of the resin. Therefore, the life up to which the assembly product is brought to the disconnection failure when subjecting the assembly products to the temperature cycling test can be greatly lengthened. In addition, since the filler containing rate of the resin can be made high, the coefficient of thermal expansion thereof can be made equal to that of Au. Furthermore, since the fluctuation of the filler distribution in the resin can be made small, the stress which is generated in the Au bumps or the resin when being applied to the temperature cycle does not fluctuate, which results in the life up to which the assembly product is brought to the disconnection failure being able to be greatly lengthened.

In addition, in the structure of the present embodiment, the thickness of the semiconductor chip is 50 $\mu$m, the printed circuit board is the polyimide film with 25 $\mu$m thickness, and the thickness of the wiring Cu foil is 3 $\mu$m, whereby the package can be thinned to the level equal to or smaller than 100 $\mu$m and also can be miniaturized to the same size as that of the chip. Thus, it is possible to provide a ultrathin and small semiconductor package.

In addition, according to the present embodiment, since the size of the bump shape is so large as to be 100 $\mu$m on the chip side and is so small as to be 40 $\mu$m in the second step, and the joining of the bumps to the pads on the board is carried out in the second step, the stress (the yield stress of Au x the joining area on the board side/the joining area on the chip side) which is applied to the chip side during the bonding can be reduced to the small value which is about one over several number of the yield strength of Au. For this reason, there is offered the effect that the chip damage under the electrodes in the flip chip assembly process can be reduced to enhance the assembly yield. In addition, since the size of the solid fillers which get mixed with the resin sheet is reduced to several $\mu$m, i.e., a level equal to or smaller than one third of the gap, there is removed the possibility that the solid fillers are piled up in a column to apply the high stress to the chip by the load thereof. Thus, there is offered the effect that it is possible to prevent perfectly the assembly failure due to that possibility.

(Second Embodiment)

As another embodiment, instead of sandwiching the resin sheet in the semi-cured state in the first embodiment between the chip and the board, the liquid epoxy resin with about 50 $\mu$m thickness containing the insulating inorganic fillers (SiO$_2$: the mean particle size is 1 $\mu$m, and the maximum value is 7 $\mu$m) is applied to the chip mounting area of the board, and thereafter immediately, the chip with the Au bumps is mounted on the liquid resin to carry out the ultrasonic wave joining, and subsequently, the curing processing at 150° C. for 30 minutes is carried out. In the case of the liquid resin, while the pad surfaces of the board are contaminated with the resin, the joining condition is made the condition of the heavy load or the high ultrasonic wave power, whereby it is confirmed that the partial metallic joining can be achieved. In this connection, as for the liquid resin, in addition to the epoxy resin, other thermosetting resin such as the phenol resin may also be employed.

In the present embodiment as well, the same effects as those of the first embodiment can be offered. In addition, since the supply of the resin becomes easy because the printing system can be adopted, there is offered the effect that the productivity can be enhanced. Also, since when the liquid resin is employed, the manday of production is less as compared with the case where the liquid sheet is employed, there is the advantage that the cost of the material is low and hence the low cost of the assembly products can be realized.

In this connection, while not particularly illustrated, when subjecting the semiconductor assembly product in which the filler containing rate in the resin sheet is 50% and the plane distribution of the fillers is equal to or lower than ±5% or less at a maximum with the dispersion in the filler containing rate in 1 mm square and the semiconductor, assembly product in which the liquid resin having the same containing rate is filled after completion of the flip chip joining and which is free from the voids to the same temperature cycling test in order to carry out the comparison, it is confirmed that there is the dear difference in the number of times of temperature cycles up to which the product is brought to the disconnection failure, and the product which is manufactured by supplying the resin in a sheet-like shape has the longer life. As this cause, it becomes clear as the result of the analysis that the filler distribution between the chip and the board in the resin sheet supplying system roughly follows the filler distribution in the resin sheet state, whereas in the liquid resin supplying system, there occurs the phenomenon that a lot of fillers are present in the upstream side area of the supply and there are not many fillers in the downstream side area, and hence the difference of 20% at a maximum occurs in the above-mentioned semiconductor assembly products.

That is, it becomes clear that the distribution of the containing rate of the fillers between the chip and the board is controlled in such a way as to become ±5% or less, whereby the temperature cycle life can be lengthened.

(Third Embodiment)

Figure 9:
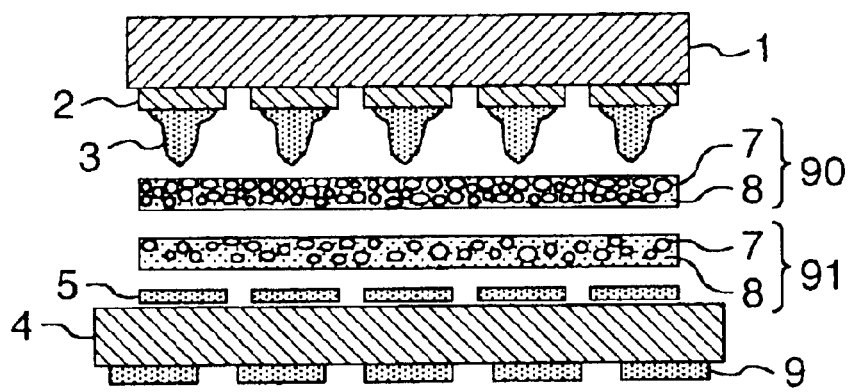
FIG. 9 is a schematic view useful in explaining another embodiment of the flip chip assembly method according to the present invention.

FIG. 9 shows an embodiment of the flip chip assembly method according to the present invention. In the figure, the Au bumps 3 are respectively formed on the electrodes (the Al electrodes) 2 of the chip 1 by utilizing the ball bonding method. At this time, the initial bump diameter is 60 μm, the diameter in the second step is 35 μm, the bump height is 80 μm, and the shoulder height in the first step is 10 μm. Two sheets of resin sheets are employed. Then, a high filter containing epoxy resin sheet (a low thermal expansion resin sheet) 90 in which the containing rate of the fillers 7 made of spheroidal $SiO_2$ particles is 65% is arranged on the chip side, while a low filler containing epoxy resin sheet (an intermediate thermal expansion resin sheet) 91 in which the containing rate of the same fillers as those of the former is 35% is arranged on the board side in order to carry out the lamination. An Au film with 0.5 μm thickness is formed on the most upper surfaces of the internal connection terminals 5 of the board 4. The joining process after having carried out the lamination in the arrangement shown in the figure is the same as that of the first embodiment.

Figure 10:
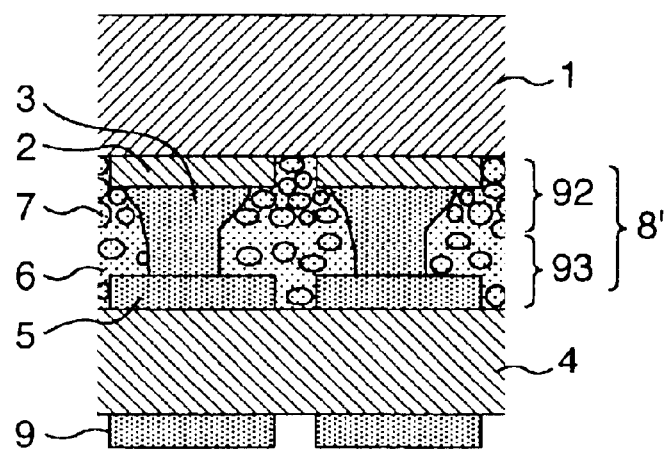
FIG. 10 is a schematic view useful in explaining an embodiment of flip chip assembly structure according to the present invention.

FIG. 10 is an enlarged view of the cross sectional structure of the joining part after having joined the elements shown in FIG. 9. In the figure, a under fill 8' includes a low thermal expansion layer 92 in which the fillers are filled with high density, and an intermediate thermal expansion layer 93 having the lower filler density, and the interface therebetween becomes the integrated structure through the inclined region in which the filler filling rate is continuously changed. At this time, the coefficient of thermal expansion of the resin in the part near the board is higher than that in the part near the chip. In addition, the containing rate of the inorganic fillers contained in the resin In the part near the board is lower than that in the part near the chip. With respect to the shape of each of the Au bumps 3 which has suffered the compression joining, the joining part on the chip side is wide, the column made of Au which is smaller than the joining part is built thereon, and the head of the column is joined to the associated one of the internal connection terminals. For the joining between the bumps and the internal connection terminals, there is provided the sate in which the metallic joining is achieved in at least a part of the contact surface.

Figure 11:
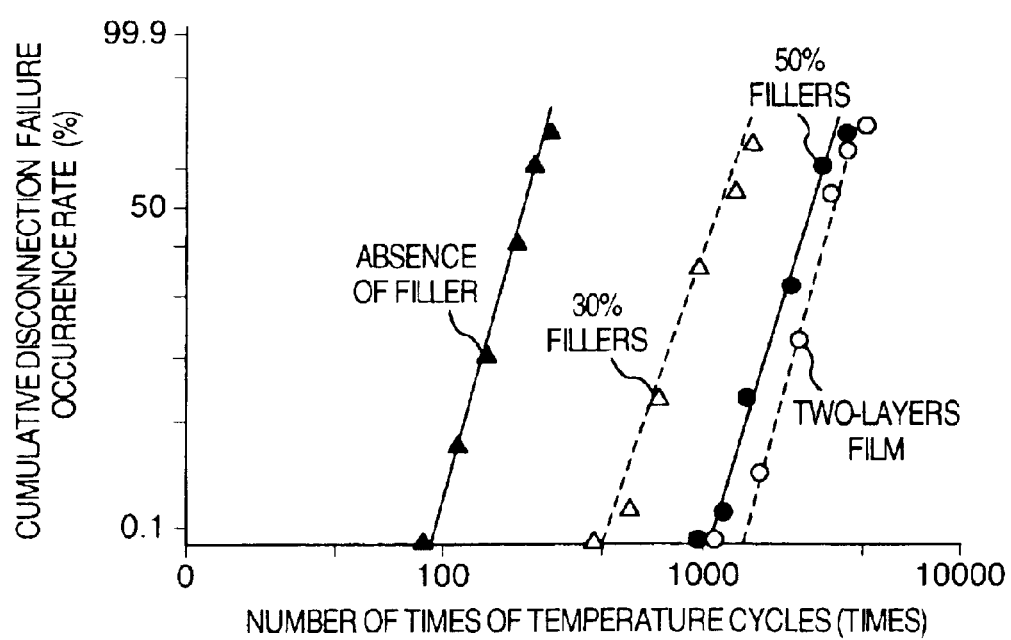
FIG. 11 is a schematic view useful in explaining the relationship between the number of times of temperature cycles and the cumulative disconnection failure generating rate which is dependent on the filler containing amount.

FIG. 11 shows the Weibull plot of the failure occurrence rate when the samples having the different filler containing amounts are subjected to the temperature cycling test. Since the under fill resin has the high thermal expansion coefficient, it is short-lived in the state in which there is no filler. When the filler material which has the lower thermal expansion coefficient than that of the under fill resin gets mixed therewith to decrease the thermal expansion, the life is lengthened. In this case, when employing the under fill resin having the filler containing rate of 50% or the two-layers under fill, there is shown the life exceeding 1,000 cycles. The method wherein the under fill having the filler containing rate of 70% or more can be filled in a void free manner is only the method according to the present invention. Thus, it is said that the two-layers system is not the possible structure until the method of the present invention has been made. That is, it is possible to provide the highly reliable flip chip assembly products by the embodiment of the present invention.

According to the present embodiment, in addition to the effects which are offered by the first embodiment, the following effects are offered. Since the under fill is divided into the two layers in such a way that the low thermal expansion resin sheet is arranged on the chip side in correspondence to Si, while the intermediate thermal expansion resin sheet is arranged on the board side in correspondence to the resin board, the coefficient of thermal expansion between the chip and the under fill and the coefficient of thermal expansion between the board and the under fill are near each other so that the generation of the shearing stress resulting from the thermal strain in both of the interfaces is reduced. As a result, the thermal stress which is generated in the joining part between the chip and the bumps as well as in the joining part between the board and the bumps can be reduced, the peeling-off between the chip and the under fill as well as between the board and the under fill can be prevented from being generated, and the peeling-off disconnection in the composition interfaces of the Au bumps can be prevented. Thus, the assembly reliability can be remarkably enhanced. By the way, while the large thermal strain is generated in the middle part of the under fill, the thermal expansion coefficient is continuously changed due to the inclination structure. Therefore, since the wide area in the central part of each of the Au bumps suffers the thermal strain, the local stress concentration is not generated. Further, since the Au bump part of the bulk suffers the stress, the reliability can be made far higher than that in the structure in which the composition interface suffers the stress.

(Fourth Embodiment)

As another embodiment, as for the materials of the bumps and the internal connection terminal surfaces of the printed circuit board in the first embodiment, there are selected Ag which is readily separated from oxygen at the temperature of 20° C. or higher though it is slightly oxidized in the atmosphere, and Pd and Pt each of which forms hardly the oxide film in the temperature region ranging from the room temperature to the joining temperature of 200° C. though it is oxidized at the high temperatures. In addition, there is attempted the assembly wherein for the resin agent for the under fill, only the composite resin of the polyimide resin and the epoxy resin is selected. Since each of the materials of Ag, Pd and Pt is soft, and also even if it is oxidized to form the oxide film, this oxide film is not so thick as to have an influence on the joining using the ultrasonic wave vibration having the amplitude of about 1 to about 5 μm, the ultrasonic wave vibration having the amplitude of about 1 to about 5 μm is applied thereto, whereby the metallic joining is readily achieved. In the present embodiment, the joining is implemented under the condition in which the frequency is 50 kHz, and the chip amplitude is 1 μm (the tool amplitude is 3 μm).

In the present embodiment as well, since the same assembly method as that of the first embodiment can be adopted and the metallic joining is achieved similarly to the case of Au, there is offered the effect that in the electrical characteristics, the connection resistance can be reduced to the range of 0.1 to 10 mΩ.

(Fifth Embodiment)

Figure 12:
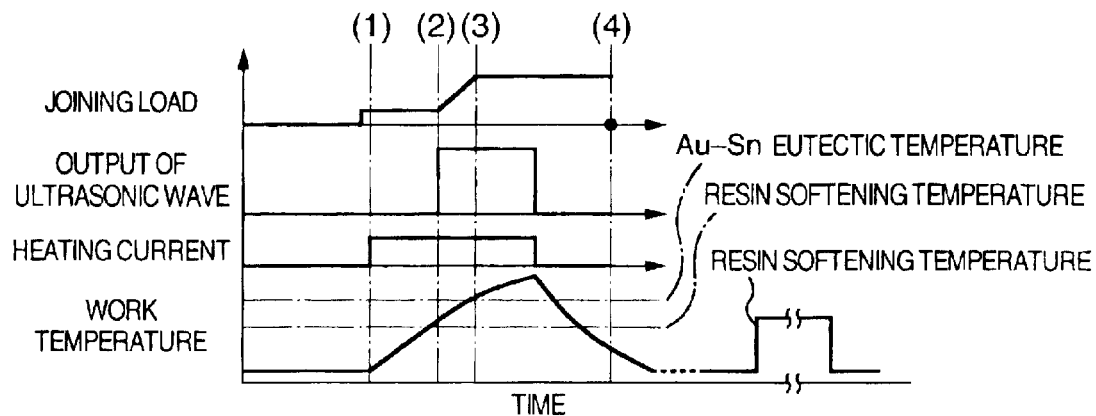
FIG. 12 is a graphical representation showing the relationship between the filler containing rate and the void generation probability in the flip chip assembly method according to the present invention.

FIG. 12 shows a time chart of the joining conditions in the case where the low-melting point metal (an Sn film) which reacts on the Au bumps to be melted at 217° C. by the eutectic reaction is formed on the internal connection terminals on the printed circuit board side to carry out the flip chip joining. While the base element structure in the assembly is completely the same as that in FIG. 1, points of difference therefrom are that the heating is carried out only from the joining tool side, and that the material of the pads is changed from Au to Sn. In FIG. 12, after having applied the load to the works, the joining tool is heated in an instant by the pulse heater, and the works are heated from the chip side. From at a time point when the temperature of the works has reached the resin softening temperature, the ultrasonic wave is applied to the works through the joining tool while increasing the load applied to the works. In the present embodiment, the heating is continuously carried out until the work temperature exceeds the Au—Sn eutectic temperature (217° C.) to reach 235° C. The time period when applying the ultrasonic wave is set in such a way that the ultrasonic wave is applied for a predetermined time after the work temperature has reached the Au—Sn eutectic temperature. In the present embodiment, the ultrasonic wave is applied for 150 ms. The application of the ultrasonic wave is stopped and roughly at the same time, the heating by the pulse heater is stopped. Then, at the time when the work temperature has dropped to 50° C. equal to or lower than the softening temperature of the resin, the load is released, and the works are taken out from the joining machine. Thereafter, the baking processing is carried out at 180° C. for 10 minutes in the heating system such as the constant temperature oven to cure perfectly the resin.

Figure 13:
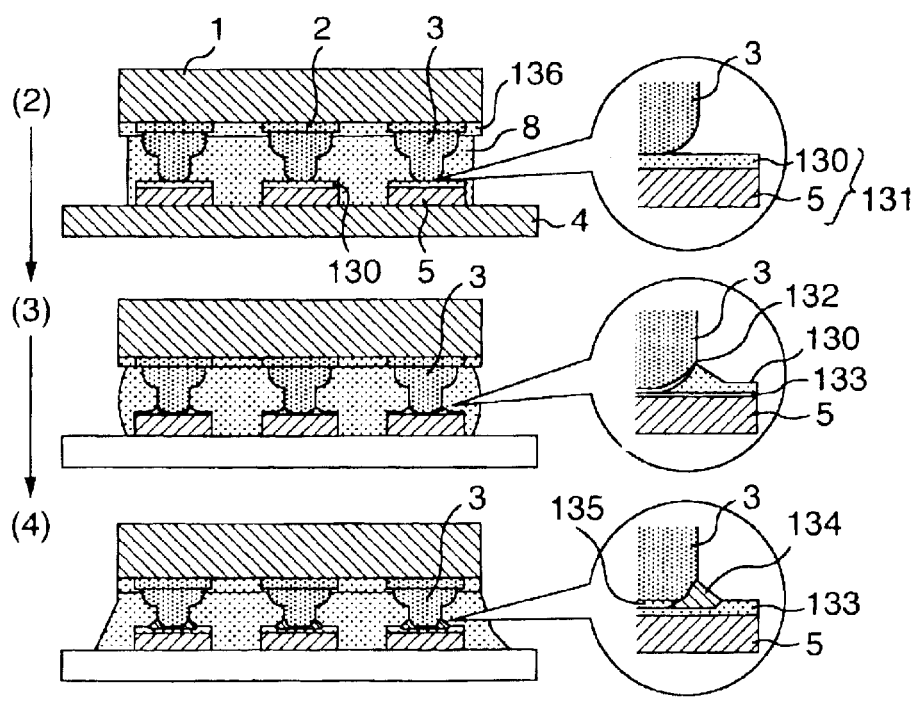
FIG. 13 is a schematic view useful in explaining still another embodiment of the flip chip assembly method according to the present invention.

FIG. 13 shows a schematic view of cross sections of the joining part at time points (2), (3) and (4) shown in the time chart of FIG. 12. In the stage of (2), the projecting Au bumps 3 are pushed into the resin sheet 8 along with the softening of the resin, and if the thickness of the resin film is suitably selected, then there is obtained the state in which the bumps 3 come into contact with the pads 131, respectively. The load is supported by the Au bumps and the surfaces 130 plated with Sn and in the solid phase. In the stage of (3), the Au—Sn eutectic reaction occurs in the region in which Au and Sn are adhered closely to each other so that the melting liquid 132 starts to be formed while Sn underlying the bumps is mechanically pushed out to the outside by the vibration friction of the Au bumps 3. In the stage of (4) in which the joining has been completed, the Au bumps 3 are joined to the internal connection terminals (the Cu pads) 5 through an AuSn layer 135 which is rich in Au and a CuSn layer 133. An Au—Sn eutectic alloy having a low melting pint which was formed in the joining process is pushed out to the peripheries of the bumps to form fillets 134. The film plated with Sn which is located outside the bumps is melted one time in the stage in which it is heated at 232° C., but reacts on the underlying Cu to form CuSn compound 133 which has a high melting pint and is isothermally solidified.

According to the present embodiment, since there is adopted the method wherein in the state in which the board, the resin sheet and the chip are laminated, the heat and the ultrasonic wave vibration are applied thereto to carry out the compression joining, the assembly method having the high productivity can be provided similarly to the first embodiment. In addition, in the combination of the joining materials of the Au bumps and the Sn plated film of the present embodiment, there is adopted the process in which the melted layer is formed in the composition interface one time to carry out the joining. Therefore, the occurrence of the joining failure due to the organic contamination or the like of the composition surface can be reduced, the joining can be carried out under the joining conditions of the light load and the low ultrasonic wave power, and the occurrence of the chip damage can be reduced. Thus, it is possible to provide the assembly method having a high yield. In this connection, since the low-melting point alloy which is formed in the composition interface is exhausted to the outside of the bumps by the application of the load and the ultrasonic wave vibration, the alloy containing Sn which is left in the composition interface at a time point of completion of the joining is only the alloy having a high melting point, and hence the melting point of metal constituting the joining part can be made equal to or higher than 275° C. Since the heating temperature in the soldering assembly is equal to or lower than 250° C., even if that alloy is heated in the soldering assembly to the printed circuit board or the like, it is not remelted. Thus, that alloy is also excellent in the high temperature heat resistance, and hence there is no problem in the heat resistance of the joining parts.

In addition, in the present embodiment, since the metallic joining is achieved, the electrical resistance of the connection part can be reduced, and also since the under fill filling which is void free is possible by employing the resin having the high filler containing rate, the assembly reliability can be enhanced. In addition, in the assembly structure of the present embodiment, similarly to the first embodiment of FIG. 1, since the package can be thinned, and also the package can be miniaturized to the size equal to that of the chip, the ultrathin and small semiconductor package can be provided.

(Sixth Embodiment)

As another embodiment, there is attempted the assembly in which the Sn as the plating material for use in the joining on the pad side in the fifth embodiment is replaced with In, Ga or TI as low-melting point metal. The joining temperature is set to 180° C. in In, 150° C. in Ga and 150° C. in TI, and other joining conditions are made the same as those of the fifth embodiment. In any of these materials, it is confirmed that the low-melting point layer can be exhausted from the composition interface to the outside by the application of the load and the ultrasonic wave vibration, and hence the joining part having a high melting point can be obtained similarly to the case where Sn is employed.

In the present embodiment as well, since the heat resistance of the joining part after completion of the joining can be enhanced, the same effects as those of the fifth embodiment can be offered. In addition, since each of In, Ga and TI has a low melting point or a lower eutectic point than that of Sn, the joining temperature can be reduced to a level equal to or lower than 200° C., the thermal stress which is generated in the cooling process after completion of the joining can be reduced, and the chip damage in the assembly process can be reduced. Thus, there is offered the effect that the assembly yield can be enhanced. In addition to the metal materials described in the present embodiment, the low-melting point metal material may be employed as long as it is constituted by metal or an alloy which has a melting temperature equal to or lower than 250° C. or in which a melting temperature is equal to or lower than 250° C. when alloyed with the precious metal bumps.

Figure 14:
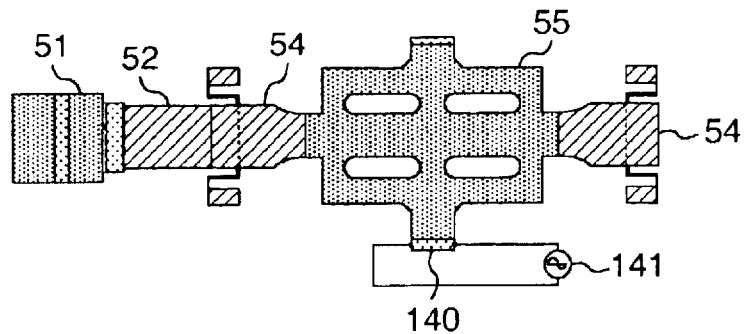
FIG. 14 is a schematic view showing another embodiment of a tool heating mechanism of the flip chip joining machine according to the present invention.

FIG. 14 shows another embodiment of the heating system for the ultrasonic wave horn. In the figure, an electrical conducting ceramic plate, i.e., a heater chip 140 is joined to the head of the joining tool which is integrated with the ultrasonic wave horn 55, and a mechanism 141 for supplying a current to the heater chip 140 is provided therefor. A current pulse is supplied to the heater chip every joining to carry out the instantaneous heating. While since the heater chip has the small heat capacity, it is heated to a high temperature during the supply of the current pulse, the supply of the current pulse is stopped, whereby the temperature of the heater chip is reduced for a short time period. This is the feature in the heater chip.

According to the present embodiment, in the case where the joining materials are the materials such as the precious metal bumps and the Sn plated pads, after the heating is simultaneously carried out from the joining tool side to melt Sn to achieve the Au—Sn eutectic joining, and the melted liquid is forcedly exhausted from the interface by the ultrasonic wave vibration to form the high-melting point joining parts, the heating can be stopped while applying the pressure to carry out the cooling for a short time period. Therefore, the joining part having the excellent heat resistance can be obtained by employing the low-melting point metal, and at the same time, the damage of the joining parts due to the thermal contraction in the cooling process can be prevented. Thus, there is offered the effect that the highly reliable joining can be carried out without injuring the productivity in the mass production line.

(Seventh Embodiment)

Figure 15:
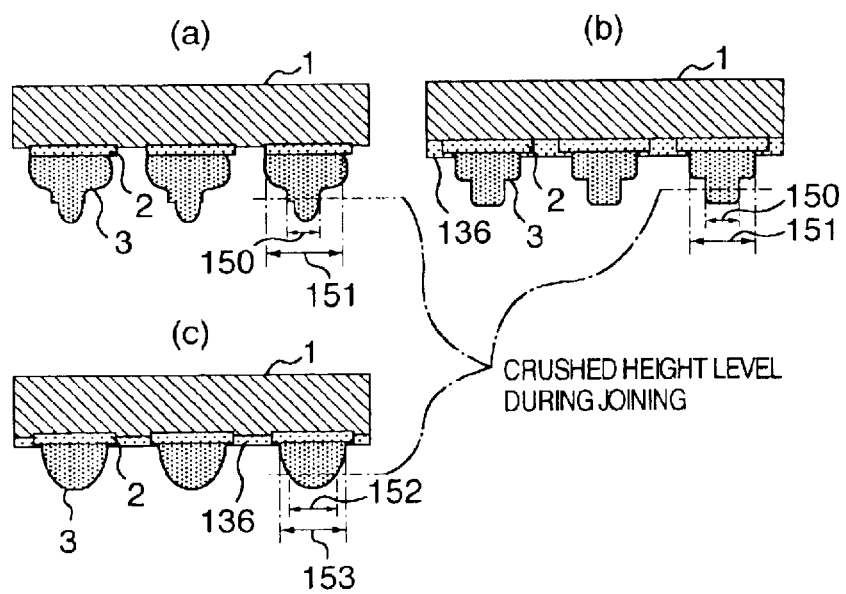
FIG. 15 is a schematic view useful in explaining the precious metal bump shape which is suitable for the flip chip assembly according to the present invention.

FIG. 15 shows an embodiment of the precious metal bump shape which is suitable for the flip chip assembly of the present invention. A part (a) of FIG. 15 shows the case of the stud bumps. In this case, the Au stud bumps 3 are respectively formed on the electrodes (the Al electrodes) 2 of the semiconductor chip (the Si chip) 1 by utilizing the ball bonding method. The initial ball size, the capillary size and the joining conditions are selected in such a way that with respect to the Au stud bump shape, the ratio of the diameter 150 at the joining crushed height level of the bump upper part to the diameter 151 of the joining part between the Au bumps and the Al electrodes becomes in the range of 1½ to ⅓ in the area ratio. When the bumps are formed under the conditions in which the initial ball size is 80 µm, the hole diameter of the capillary tool is 40 µm and the ball diameter after completion of the compression joining is 100 µm, if the load: 50 g/bump, the temperature: 100° C., the vibration amplitude: 3 µm, and the joining time: 30 ms are selected as the joining conditions of the flip chip, then the diameter of the composition surface on the chip side can be set to the range of 80 to 90 µm and also the diameter of the bonding surface on the board side can be set to the range of 40 to 45 µm. In addition, a part (b) of FIG. 15 shows the case of the two-step plated bumps. In this case, the diameter ratio is selected in such a way that the area ratio of the second step to the first step becomes in the range of ½ to ⅓ or less. Also, a part (c) of FIG. 15 shows the case of the plated bumps each of which is of the shape having the sharp head. In this case, the shape is controlled in such a way that the area ratio of the joining crushed height position to the base of the bump becomes in the range of ½ to ⅓ or less. In FIG. 15, reference numeral 136 designates a passivation film. In addition, reference numerals 152 and 153 designates a diameter of a upper part and a diameter of a lower part, respectively.

Figure 16:
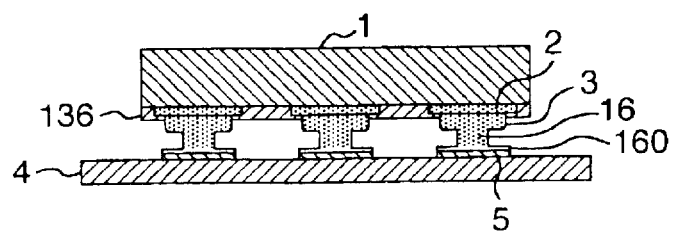
FIG. 16 is a schematic view useful in explaining another embodiment of the flip chip assembly structure according to the present invention.

FIG. 16 shows the cross sectional structure of the flip chip assembly part when the plated bumps shown in a part (b) of FIG. 15 are employed. With respect to the joining area, the area of the interface of the bump/the barrier metal/the Al electrode is about 0.0036 mm$^2$, and the joining area of the bump/the Au plated land of the board is about 0.00081 mm$^2$. Thus, the joining area of the latter is made so small as to be about 23% of the joining area of the former. While the whole plated bump 3 of the figure is made of Au, alternatively, the bumps in each of which the first step is formed of Cu metal plating and the second step is formed of Au metal plating, and their heights are respectively 10 µm and 20 µm are manufactured by way of trial. In the figure, reference numeral 160 designates Au metal plating.

Figure 17:
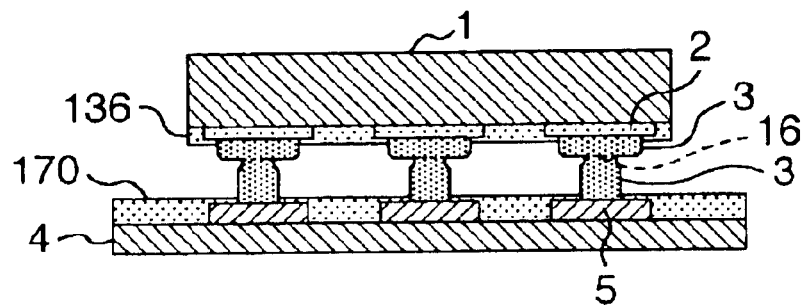
FIG. 17 is a schematic view useful in explaining still another embodiment of the flip chip assembly structure according to the present invention.

FIG. 17 shows the cross sectional structure of the flip chip assembly part when the Au bumps are respectively formed on the chip side and the board side. Now, the size is adjusted in such a way that the ratio of the area of the transverse section of each of the Au plated bumps 3 on the chip side to the area of each of the joining parts becomes in the range of 2 to 3 or more. Also, the bump size on the chip side is set to 60 µm square, and the bump size on the board side is set to 40 µm square. In the figure, there are implemented the structure in which the Au plated bumps are formed both on the chip side and on the board side, the structure in which the Ni/Au plated bumps are formed only on the chip side, the structure in which the bumps plated with Cu/Ni and Ni/Au are formed on the board side, and the structure in which the Au stud bumps are formed on the board side. In FIG. 17, reference numeral 170 designates a plated resist film.

In these embodiments, in any case, there is adopted the structure in which the area of the base of the bump on the chip side is 2 to 3 times as large as that of the composition interface. Therefore, the stress which is applied to each of the Al electrodes on the chip side in the flip chip joining by utilizing the ultrasonic wave becomes ½ to ⅓ or less of the yield strength of Au (60 to 80 MPa). As a result, the occurrence of the chip damage is prevented, which results in the assembly having a high assembly yield becoming possible.

In addition, the shape of each of the precious metal bumps is preferably selected in such a way that the joining area on the chip side becomes larger than that on the board side by 40 percent or more. Normally, in the flip chip joining by utilizing the ultrasonic wave, there is the possibility that the large shearing stress is generated in the chip board underlying the bumps to generate the chip damage. However, since the value of the shearing stress which is applied to the chip side through the bumps becomes the value which is obtained by multiplying the yield strength of each of the Au bumps by the area ratio between the board side and the chip side, in the present invention, that value can be reduced to 70 percent or less of the yield strength of each of the Au bumps, and hence the occurrence of the damage can be greatly reduced.

(Eighth Embodiment)

Figure 18:
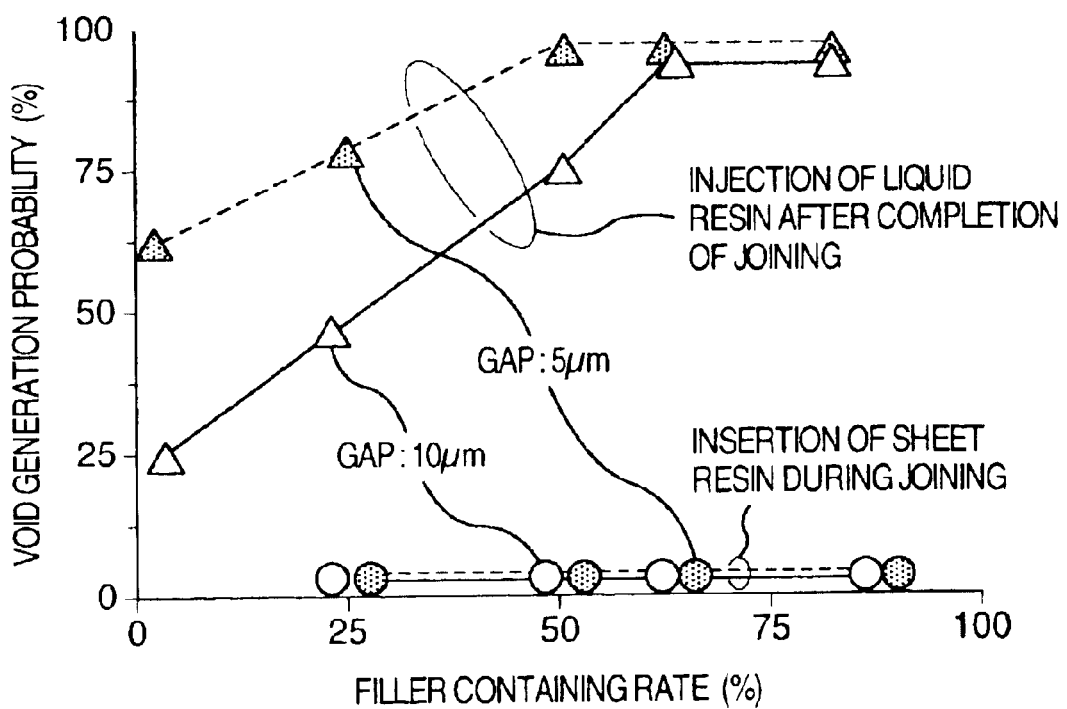
FIG. 18 is a graphical representation showing the relationship between the filler containing amount and the void generation rate which is dependent on a space defined between the chip and the board.

FIG. 18 shows the relationship between the SiO$_2$ filler containing amount and the void generation rate of the epoxy resin based under fill in the flip chip assembly when employing the Au plated bumps. In the Au plated bumps, since if the bump height is increased, then the cost is correspondingly increased that so much, the bumps each of which is as low as possible will be employed. The lowest height becomes the height at which the warpage of the board and the dispersion in the thickness thereof, and the dispersion in the pad height can be absorbed by the deformation of the bumps. While in the case of the gap of 5 µm as well as the case of the gap of 10 µm, even if no filler is contained, the void generation probability is high, in the sheet insertion system, the probability of generation of the voids each having the size of several tens µm or more becoming a problem can be made zero irrespective of the gap.

Figure 19:
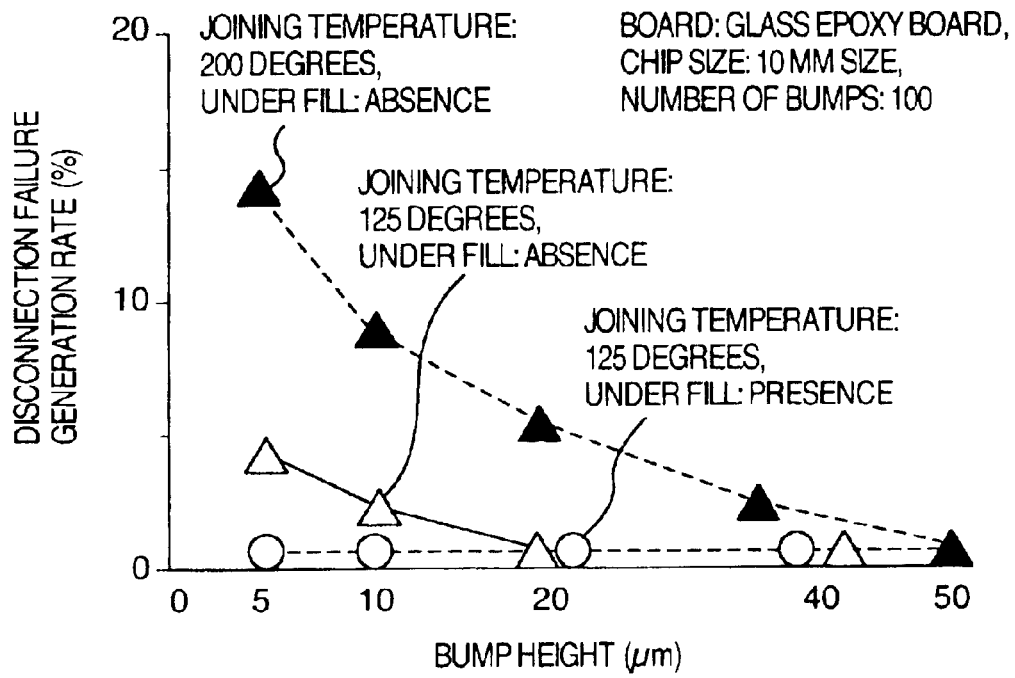
FIG. 19 is a graphical representation between the bump height and the cumulative disconnection failure occurrence rate which is dependent on the presence and the absence of the under fill and joining temperatures.

FIG. 19 shows the relationship between the bump height and the disconnection failure occurrence rate in the temperature cycling test when the joining temperature and the presence and absence of the under fill are changed. In the case where the under fill is absent, in the region in which the bump height is equal to or smaller than 50 µm, the graph shows a tendency in which the disconnection failure is easy to occur as the height is lower, and also shows a tendency in which the permanent set is increased to increase the disconnection failure occurrence rate as the joining temperature is higher. When filling the under fill, the chip and the board are firmly bonded to each other so that the difference in the thermal expansion between the chip and the board is absorbed by the warpage deformation, which prevents the large shearing stress or tensile stress from being generated in the bumps. Therefore, the life up to which the product is brought to the disconnection failure is greatly improved. As a result, within the test standards which are required for the semiconductor devices, any of the products is not brought to the disconnection at all.

(Ninth Embodiment)

Figure 20:
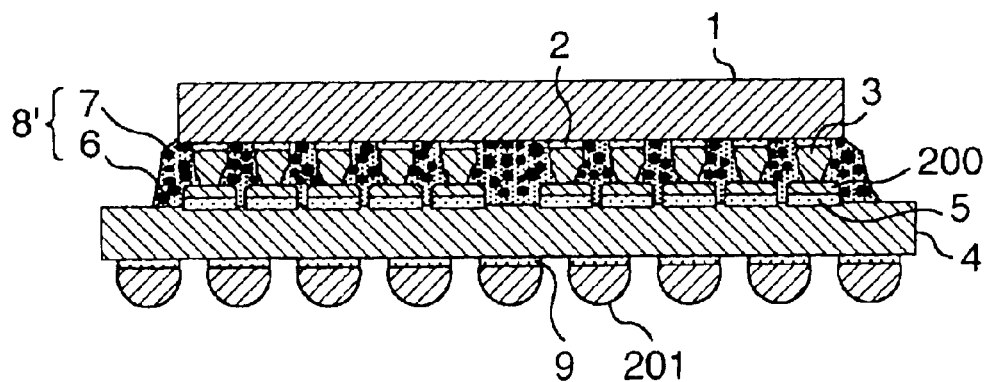
FIG. 20 is a schematic view useful in explaining an embodiment of a BGA package having the flip chip assembly structure according to the present invention.

FIG. 20 shows an example of the cross sectional structure of a BGA package to which the flip chip assembly structure according to the present invention is applied. In the figure, the Au bumps 3 which have been formed by the tearing-off type of the ball bonding method are respectively loaded on the Al electrodes 2 which are arranged on the area of the semiconductor chip (the Si chip) 1. A film 200 of Ni with 5 $\mu$m thickness/Au with 0.5 $\mu$m thickness is formed on the internal connection terminals (the Cu pattern) 5 each with 35 $\mu$m thickness in the positions corresponding to the Al electrodes of the chip on the chip side of the printed circuit board (the glass epoxy board) 4 by the electroless plating. On the opposite side of the board, the pads for the solder bumps (the external connection terminals) 9 each of which is made of the same material as that of the surface on the chip side are formed, and the solder ball bumps are loaded thereon. Since the Au plating of the pads dissolves into the solder when loading the solder, the Ni plated film and the solder are directly joined to each other in the state of completion of the package. The Au bumps on the chip and the Au plated pads on the board are electrically connected to each other through the metallic bonding by the thermal compression joining utilizing the ultrasonic wave, and the space defined between the chip and the board is filled with the under fill 8' containing the insulating inorganic filler 7 (SiO$_2$ particles) showing the low thermal expansion and the thermosetting resin (the epoxy resin) 6. The volume ratio of the epoxy resin to the SiO$_2$ particles is 1:2. The bump height is 60 $\mu$m, the diameter of the Au/Au joining part is 30 $\mu$m, and the diameter of the Au/Al joining part is 80 $\mu$m. The bump height is deformed from the initial value of 100 $\mu$m to 40 $\mu$m, and the wire part is crushed to the level equal to the second step shoulder which is formed in the hole of the capillary or up to the position which is slightly near the head.

According to the present embodiment, since the joining is carried out at the head parts of the stud bumps, the joining can be carried out with the light load of several tens to several hundreds mN per bump, and even in the case of the multipin LSI chip having several thousands pins, the flip chip assembly can be carried out by the Au/Au metallic joining without generating any of the chip cracks. In addition, since the bump height is increased and the chip and the board are firmly bonded to each other by the under fill showing the low thermal expansion, the strain which is applied to the joined bumps becomes very small. Also, since as another effect of the under fill resin, the strain is equally dispersed among the whole bumps, the temperature cycle reliability as the package can be remarkably enhanced. In addition, since the mother board and the chip can be electrically connected with shortest distance, even when the high performance LSI in which the clock frequency of the chip exceeds several hundreds MHz is loaded, the assembly for the electronic apparatus becomes possible without injuring the performance thereof. Also, with respect to the wiring distributed between the internal connection pads and the external connection pads, the number of wirings distributed between the adjacent pads can be reduced by utilizing the through hole(s) as much as possible. As a result, the pitch of the external connection pads of the board can be shortened, which makes possible the miniaturization of the package size. In addition, since the heat resistance of the internal connection parts is sufficiently higher than the refractory temperature of the resin, any of the problems does not arise at all in the solder reflow process in which the package is mounted to the printed circuit board.

(Tenth Embodiment)

Figure 21:
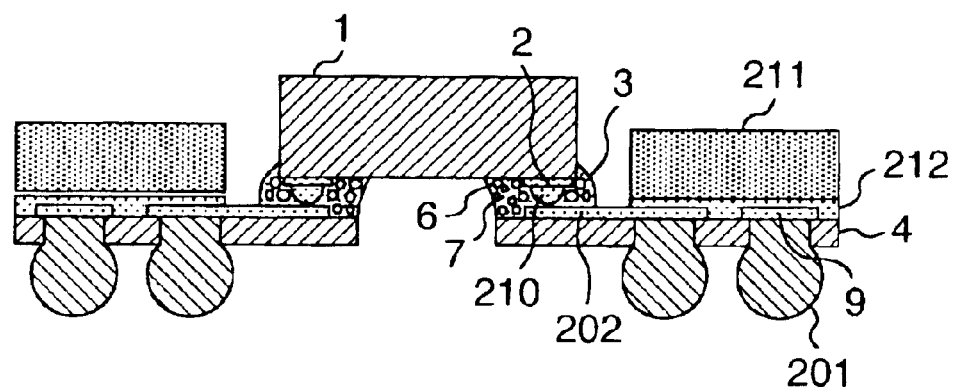
FIG. 21 is a schematic view useful in explaining another embodiment of a BGA package having the flip chip assembly structure according to the present invention.

FIG. 21 shows an embodiment of the cross sectional structure of a tape BGA package to which the flip chip assembly structure according to the present invention is applied. In the figure, the Au plated bumps 3 are respectively formed on the electrodes (the Al electrode pads) 2 of the semiconductor chip (the Si chip) 1. An opening part which is smaller than the pad formation area of the chips is provided at the center of the printed circuit board (the tape board) 4 containing, as the basic constituent, the polyimide film with 50 $\mu$m thickness, and a Cu wiring pattern 202 with 5 $\mu$m thickness is formed on one side. Each of the surfaces of the internal connection leads 210 has the Au plated layer with 0.5 $\mu$m thickness, and the solder ball bumps 201 are respectively formed on the pads (the external connection terminals) 9 for the solder bumps each of which is formed by providing the opening in the tape board. For the purpose of preventing the deformation of the tape, the stiffeners 211 are adhered through the adhesive agent 212 to the tape board of the area, in the periphery of the chip, in which the solder bumps are formed. The Au bumps and the internal connection leads of the chip are connected to each other through the Au/Au metallic joining, and the space defined between the tape and the chip is filled with the resin containing the spheroidal fillers each of which has the lower thermal expansion coefficient than that of the resin. Each of the Au bumps is of a square of 20 $\mu$m×20 $\mu$m, and the Au bumps are joined under the condition in which the height after completion of the compression joining is 10 $\mu$m in the low position. Then, the assembly is carried out under the conditions in which the joining temperature is 100° C., the joining load is 50 mN/bump, and the vibration amplitude of the ultrasonic wave is 3 $\mu$m in the tool and 1.5 $\mu$m in the chip. Then, the assembly is carried out in the order of the chip joining+the under fill filling, the stiffener bonding, and the solder ball loading. In this case, since the under fill has the shape which is free from the generation of the voids, it may be led thereinto after completion of the joining. The slitting is formed in plural pins from the opening part, in the chip connection area of the tape board.

According to the present embodiment, since the combination in which the internal connection leads on the tape board and the bumps of the chip are joined to each other is adopted, and the Cu thickness of the tape board is set to 5 $\mu$m, the wiring pitch can be made the pitch of 30 $\mu$m, and hence the LSI chip having so narrow pad pitch as to be 30 $\mu$m can be flip-chip assembled. In the conventional joining, since the joining temperature is so high as to be equal to or higher than 200° C. (230° C. in the Au—Sn eutectic joining), the strain due to the thermal expansion of the tape board and the thermal expansion of the Cu foil, and the position shift due to the thermal expansion difference to the chip become the problems. However, in the assembly method according to the present invention, since the joining temperature can be made drop to the room temperature, even in the connection having the fine pitch, the metallic joining can be made with high accuracy, and hence it is possible to provide the highly accurate and highly reliable flip chip assembly structure. In addition, in the package after completion of the assembly, the under fill resin showing the low thermal expansion is solidified for the connection parts and the opening is formed at the center of the tape board. Therefore, in the temperature fluctuation under the practical use environment, the thermal strain which is applied to the bump joining parts can be reduced by the fixing effect of the under fill and the effect of absorbing the strain by the slit(s), and hence the temperature cycle reliability of the package can be greatly improved. In addition, since the heat resistance of the internal connection part is sufficiently higher than the refractory temperature of the resin, in the solder reflow process In which the package is mounted to the printed circuit board, there is no problem.

(Eleventh Embodiment)

Figure 22:
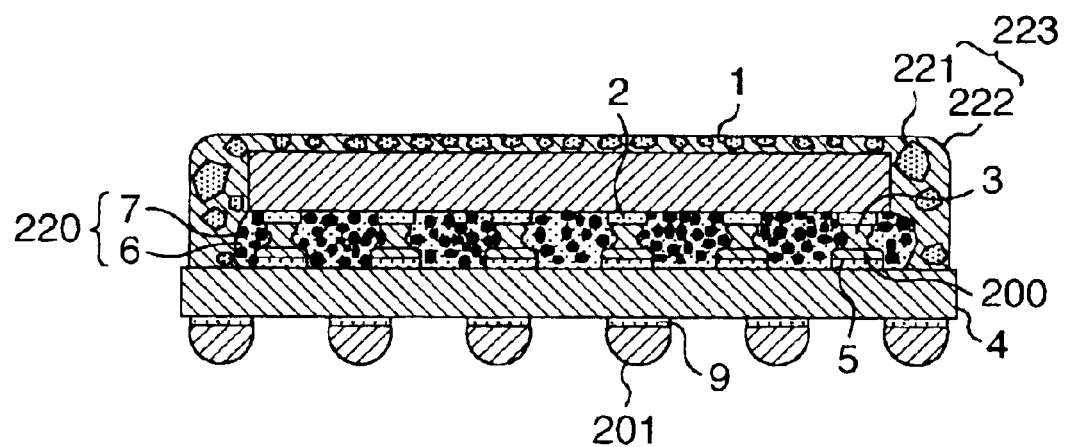
FIG. 22 is a schematic view useful in explaining still another embodiment of a BGA package having the flip chip assembly structure according to the present invention.

FIG. 22 shows an embodiment of the package cross sectional structure when the flip chip assembly structure of the present invention is applied to the semiconductor package which is of a one side resin mold type. In the figure, the Au stud bumps 3 are respectively formed on the Al electrodes 2 of the semiconductor chip (the LSI chip) 1. The wiring pattern and the internal connection pads are formed on the chip side of the printed circuit board (the organic carrier board) 4 containing the glass cloth and the epoxy resin. Each of the internal connection pads is constituted by each of the internal connection terminals (the Cu pads) 5 and the Ni/Au plating 200 formed thereon. The external connection terminals 9 are formed on the lower side of the board, and the solder bumps 201 are respectively formed on the external connection terminals 9. The metallic joining of Au/Au by the ultrasonic wave joining method of the present invention is achieved for the internal connection pads and the Au stud bumps. The gap defined between the chip and the board is filled with the first resin 220 containing the thermosetting resin 6 and the spheroidal insulating inorganic fillers 7 each of which shows the lower thermal expansion than that of the thermosetting resin 6 and has the size equal to or smaller than ⅓ of the above-mentioned gap. In addition, one side of the board is molded with second resin 223 containing grinding-shaped large filler particles 221 each showing the low thermal expansion and thermosetting resin 222 in such a way as for the chip to be covered. By the way, the large filler shape is not limited to the grinding type, and hence may be spheroidal or of other shape as long as the cost permits.

According to the present embodiment, there is adopted the method wherein the process of joining the chip to the organic carrier board is carried out through the process of sandwiching therebetween the resin sheet to form the flip chip assembly. Therefore, the multipin batch joining and the under fill resin filling can be carried out at the same time, and also the voids which are easy to be generated in the gap defined between the chip and the board can be perfectly removed. Thus, the problems of the reduction of the productivity as compared with the wire bonding method, the reflow cracks due to the generation of the voids, and the like can be solved. In addition, the whole chip is molded, whereby the force of pressing the chip against the board becomes strong as compared with the structure of only the normal under fill encapsulation, and the compressive stress acts on the internal connection parts at all times. As a result, the problem that the cracks are generated in the joining parts due to the thermal strain in the temperature cycle or the like to bring the product to the disconnection can be prevented, and also it is possible to provide the package which has the very high reliability. Then, it is to be understood that there are the advantages that the electrical characteristics are excellent, the heat resistance of the internal connection is high and hence there is no problem in terms of the mounting of the printed circuit board, and the package height can be reduced.

(Twelfth Embodiment)

Figure 23:
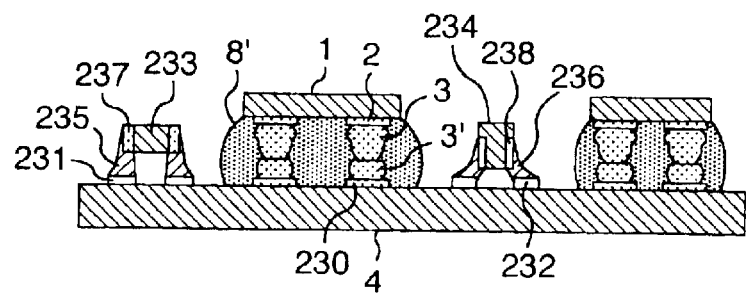
FIG. 23 is a schematic view useful in explaining an embodiment of a ceramic module having the flip chip assembly structure according to the present invention.

FIG. 23 shows an embodiment in which the flip chip assembly structure of the present invention is applied to a ceramic module. In the figure, Ag series thick film conductor patterns 230, 231 and 232 which were formed by the printing and the firing are formed on the printed circuit board (the ceramic substrate) 4. The Au stud bumps 3 are formed on the conductor pattern 230, which is flip-chip connected, by the ball bonding to be flattened by the leveling processing. Passive components 233 and 234, and the conductors on the ceramic substrate are electrically connected to each other through the Sn series solder 235 and 236. The Au stud bumps 3 are formed on the Al electrodes 2 of the semiconductor chip (the bare chip) 1 by utilizing the tearing-off method and are metallically joined to the flattened Au stud bump surfaces of the ceramic substrate through the Au—Au metallic joining. Right before carrying out the joining process, the surfaces of the flattened Au stud bumps are cleaned by utilizing the sputtering cleaning method in order to carry out the assembly. The space defined between the chip of the module and the substrate is filled with the thermosetting under fill resin 8' containing 70% or more $SiO_2$ fillers each showing the low thermal expansion. The flattened bump size on the substrate side is 15 $\mu$m (thickness)×80 $\mu$m (diameter), and the bump size on the chip side is 80 $\mu$m (height)×60 $\mu$m (diameter) in the initial values and that bump size after completion of the compression joining is 40 $\mu$m (height)×60 $\mu$m (diameter). The parts which are crushed by the joining are up to the wire part and the upper part in the second step which is formed by the capillary hole, and the base part in the first step which is formed as the result of crushing the initial ball is hardly deformed. The joining is carried out under these joining conditions.

According to the present embodiment, as compared with the bare chip loaded module by C4 using the conventional solder bumps, the LSI connection pad pitch can be reduced from 300 $\mu$m or more level to 100 to 200 $\mu$m level, and hence the LSI chip which is manufactured for the normal wire bonding mounting can be applied to the flip chip assembly as it is. Thus, there is the advantage that the low cost can be realized. In addition, when the solder for C4 is the high-melting point solder, there is the problem that the assembly is difficult to be carried out in the lead (Pb) free manner, which becomes a problem in terms of the environmental pollution. Thus, there is the problem that if the lead-free Sn series solder is used, then the solid phase temperature becomes equal to or lower than 220° C., and hence the solder which can be used in the subsequent soldering mounting suffers the restriction in terms of the melting point, whereas in the present embodiment, there is the advantage that the solder free style and the heat resistance can be simultaneously achieved. On the other hand, as compared with the bare chip loaded module utilizing the wire bonding method, in the wire method, there is the problem that the space required for the loading becomes larger than the chip size and hence the high density mounting is difficult in principle to be carried out and also the electrical characteristics can not be improved (for the high speed transmission) due to the presence of the inductance component of the wire, whereas in the present embodiment, both of the high density mounting and the high speed signal transmission can be simultaneously achieved.

(Thirteenth Embodiment)

Figure 24:
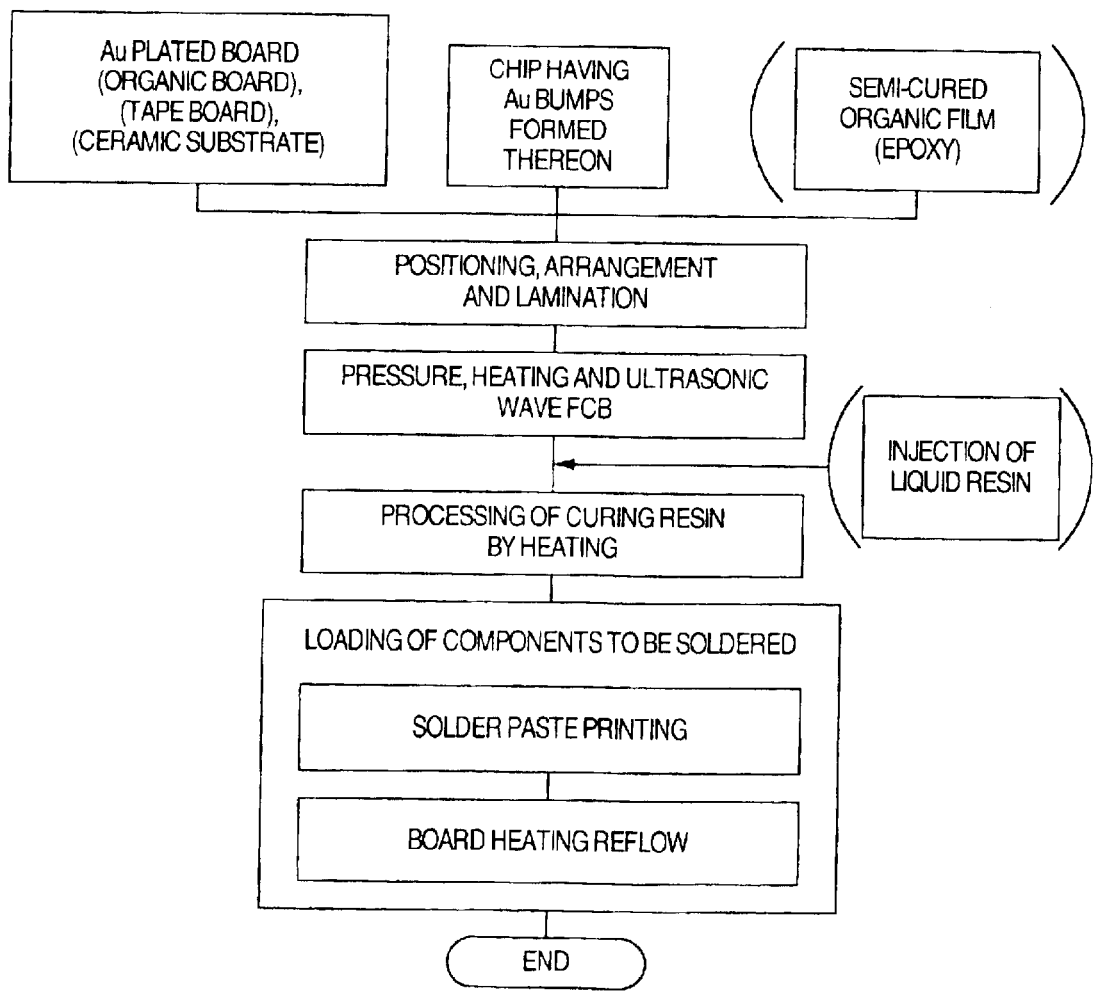
FIG. 24 is a flow chart useful in explaining an embodiment of the procedure of assembling a module including the flip chip assembly of the present invention.

FIG. 24 shows an embodiment of the procedure of assembling the various modules. There are prepared as the members the module board in which the chip connection pads are plated with Au, the LSI chip having the Au bumps formed thereon, and the semi-cured organic film or the liquid resin. In the case of the organic film, the module board, the organic film and the LSI chip are laminated with the positions of their connection terminals aligned with each other to be loaded, and then the Au bumps break through the softened organic film to be metallically joined to the Au pads, respectively, by applying thereto the pressure, the heat and the ultrasonic wave. Thereafter, the heating is held to cure the resin, and the solder paste printing is carried out to load thereon the component to be soldered, and the reflow processing is carried out to perform the soldering. On the other hand, in the case where the liquid under fill resin is used, in the joining process, only the board and the chip are aligned with each other to carry out the flip chip joining first of all, and thereafter, the liquid resin is injected into the space defined between the board and the chip by the capillary phenomenon or the application of the pressure to carry out the curing processing. Thus, the assembly is carried out on the basis of such a procedure.

In this assembly procedure, from a respect that in the process of carrying out the flip chip joining, the cleanness degree of the board is high and also any of the additional components is absent in the periphery thereof, there is the advantage that there is no restriction in terms of the joining. However, since in the solder paste printing process, the bare chip which has already been loaded becomes an obstacle to the printing, there arises the problem that the suitable device needs to be made for the printing method.

(Fourteenth Embodiment)

Figure 25:
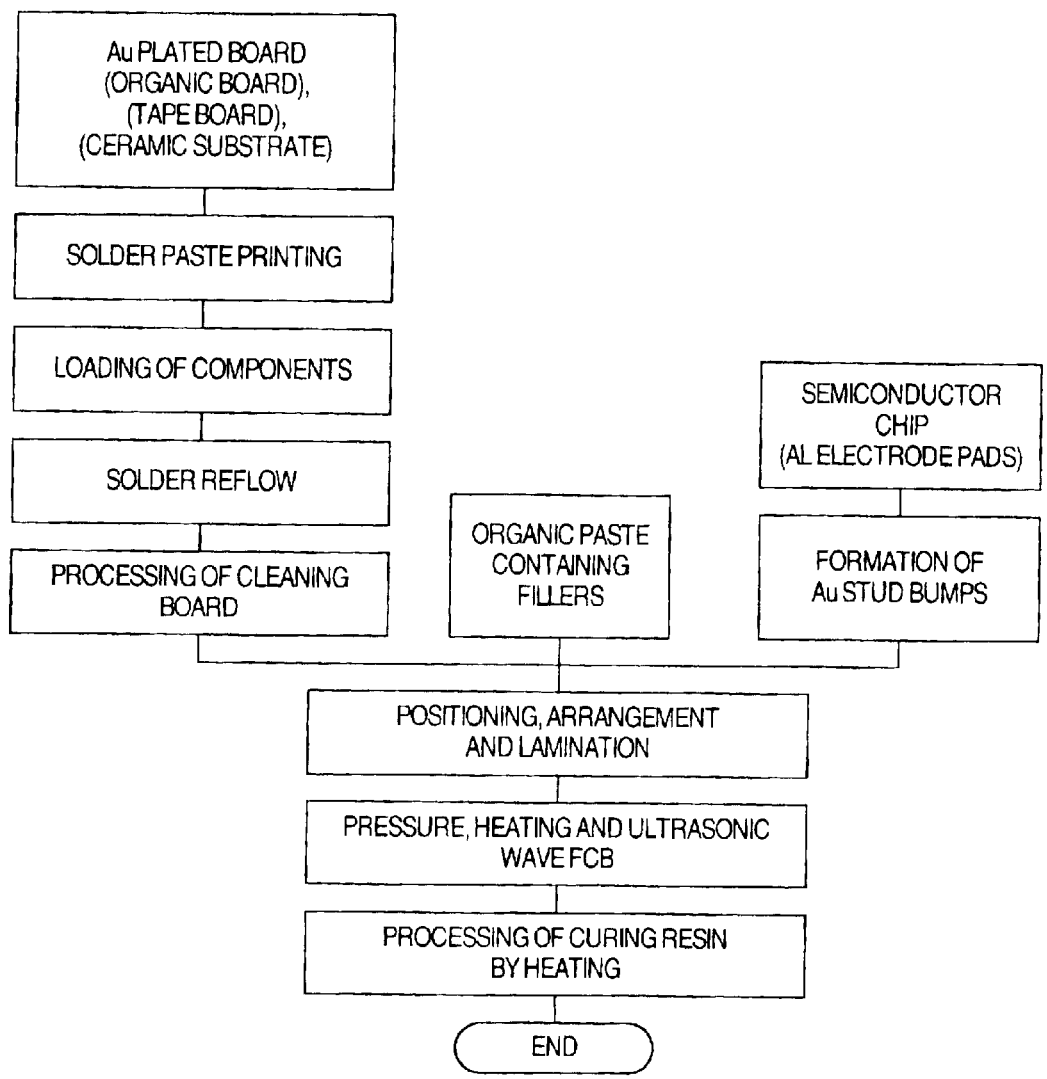
FIG. 25 is a flow chart useful in explaining another embodiment of the procedure of assembling a module including the flip chip assembly of the present invention.

FIG. 25 shows another embodiment of the procedure of assembling the ceramic module which is reverse to FIG. 24. The same members as those in FIG. 24 are prepared. First of all, the components to be soldered are loaded on the module board through the printing and reflow process. Since in this process, the conductor pattern of the board is contaminated by the organic vapor such as flux or the diffusion to the surface of the underlying material(s), after having loaded the components to be soldered, the cleaning by the organic agent and the cleaning processing by the sputtering cleaning are carried out. Thereafter, the organic paste containing the fillers is applied onto the board and the chip having the Au bumps formed thereon is positioned to be loaded, and then is joined thereto by the application of the heating and the pressure utilizing the ultrasonic wave. Finally, the semi-cured organic resin is perfectly cured to complete the assembly.

In accordance with this assembly procedure, there is the advantage that the components to be soldered can be readily loaded, while since the conductor surfaces to be subjected to the flip chip joining are contaminated, the adoption of the cleaning process is essential, and hence there is also the disadvantage that the number of assembly processes is increased. Thus, the assembly procedures in FIG. 23 and FIG. 24 are selected after grasping the advantage and the disadvantage depending on the module products.

(Fifteenth Embodiment)

Figure 26:
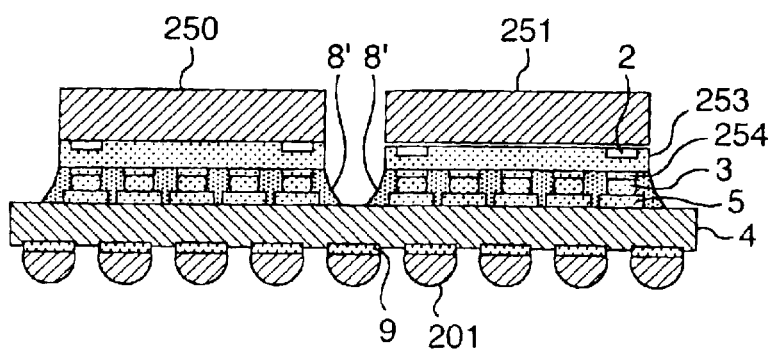
FIG. 26 is a schematic view useful in explaining an embodiment of a multichip module having the flip chip assembly structure according to the present invention.

FIG. 26 shows an embodiment of the cross sectional structure of a multichip module employing an organic board according to the present invention. In the figure, a rewiring layer 253 is formed on the surfaces of LSI chips 250 and 251, and the chip electrodes 2 which are arranged in the periphery are rearranged on the whole surfaces of the chips. While each of the chip electrodes is made of an Al alloy, each of rearranged electrodes 254 is made of the material in which the core is made of Cu and the most upper surface is made of Au. The Au bumps 3 are respectively formed on the rearranged electrodes by utilizing the ball bonding method or the plating method. The organic printed circuit board (the organic module board) 4 is made of glass epoxy resin, and the internal connection terminals 5 are formed on the face thereof on the chip side, while the external connection terminals 9 are formed on the face thereof on the opposite side. Sn based solder bumps 201 are respectively formed on the external connection terminals. Each of the internal connection terminals has the structure in which the Cu core is plated with Au, and the Au bumps of the chip are metallically joined thereto. The space defined between the chip and the board is filled with the thermosetting under fill resin 8' containing the minute spheroidal fillers each having the lower thermal expansion coefficient than that of the resin. The gap between the chip and the chip is filled with the under fill resin in the form of the organic film, whereby even for the narrow gap of about 1 mm, the under fill resin is cut off. The plane distribution of the minute spheroidal fillers contained in the under fill resin is controlled in such a way that the dispersion in the containing rate when obtaining the filler containing rate of 1 mm square size from an arbitrary place is equal to or smaller than ±5% at a maximum. This can be realized only by the method wherein the under fill resin is supplied in the form of the sheet in which the fillers are uniformly dispersed.

According to the present embodiment, since the rewiring layer is formed on the chips to rearrange the electrodes, the pitch and the arrangement of the electrodes can be selected irrespective of the pitch and the arrangement of the initial chip electrodes, and hence no matter what kind of a specification the chip of interest has, it can be loaded on the module board. Therefore, if the connection electrodes are concentratedly arranged in the center of the chip, then the distance between the farthest bumps is shortened. As a result, the maximum thermal deformation which is generated in proportion to that distance can be reduced, and hence the thermal fatigue life can be greatly lengthened. In addition, if the connection electrodes are dispersed into the whole surface of the chip, then the electrode pitch can be roughed. Thus, since the work of aligning the chip with the module board becomes easy to be carried out and at the same time, the manufacture of the module board may be of low accuracy, there is the advantage that the low cost can be realized. In addition, since in the flip chip joining process, the rewiring layer plays a part of the buffer layer for the stress which is applied to the chip through the bumps, the occurrence of the chip damage is removed. Thus, there is also the advantage that the assembly yield can be greatly enhanced. In addition, the under fill resin between the chips is cut off, whereby the shearing strain which is applied to the bump joining part due to the generation of the thermal deformation of the under fill resin itself can be reduced, and also the reliability of the joining part can be enhanced.

(Sixth Embodiment)

FIG. 7 is an enlarged photograph of the bump joining part which is obtained in such a way that the organic resin sheet with 50 $\mu$m thickness made of the semi-cured epoxy resin containing 60% $SiO_2$ fillers having the mean particle size of 0.5 $\mu$m is inserted between the chip having the Au stud bumps formed thereon and the board having the Ni/Au plated pads formed thereon to join them to each other under the conditions in which the heating temperature is 180° C., the joining load is 100 g/bump (the chip load: 25.6 kg), the amplitude of the ultrasonic wave is 3 $\mu$m, and the oscillation time is 300 ms. In this connection, the viscosity of the semi-cured resin sheet at 180° C. is 100 Pa/s. Then, the Au bumps break through the resin sheet to come into contact with the Au pads, respectively, and the solid fillers are exhausted from the composition interface to achieve the metallic joining, whereby there is formed the joining part having the ratio of the diameter of the composition plane on the chip side: the diameter of the composition plane on the board side=100:48. In the case where there is employed the resin sheet having the viscosity of 10 Pa/s at 180° C. which is obtained by reducing the semi-curing temperature, It is confirmed that the joining part having roughly the same shape as that of the joining part of FIG. 7 is obtained under the condition in which the joining load is 50 g/bump.

According to the present embodiment, since the joining area on the board side can be made so small as to be ¼ of the joining area on the chip side, the stress which is applied to the elements on the chip side and the insulating multilayer film structure part when carrying out the joining by applying the ultrasonic wave can be reduced to ¼ or less (3 kg/mm² or less) of the Au yield strength. Thus, there is offered the effect that the chip damage in the joining can be reduced. In addition, if the viscosity in heating the resin sheet is further reduced from 10 Pa/s, then the joining load can be further reduced from 50 g/bump for the joining, the stress which is generated in the chip due to the application of the load can be reduced, and also the probability of generation of the chip damage can be further reduced. Thus, there is offered the effect that the assembly yield can be enhanced.

(Seventeenth Embodiment)

Figure 27:
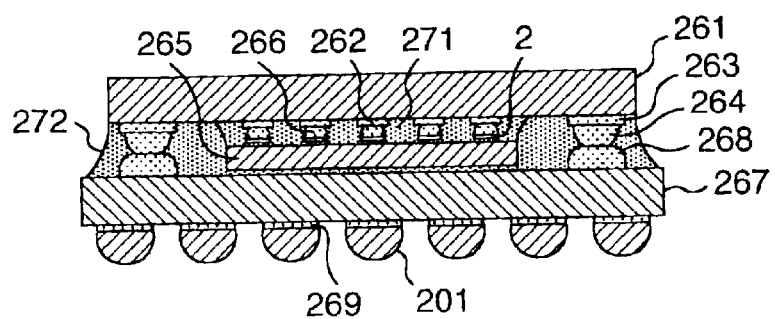
FIG. 27 is a schematic view useful in explaining an embodiment of a lamination type multichip package having the flip chip assembly structure according to the present invention.

FIG. 27 shows an embodiment of the package cross sectional structure when the flip chip assembly structure of the present invention is applied to the multichip package of a lamination type. In the figure, bumps 266 plated with Au are respectively formed on the electrodes 2 of a first chip 265. Internal connection electrodes 262 of a second chip 261 and the Au plated bumps are joined to each other by utilizing the assembly method of the present invention. Each of the most upper faces of the electrodes 262 is made of an Au film which is formed by the evaporation or the plating. The space defined between the chips is filled with first under fill resin 271. Au stud bumps 264 are respectively formed on external connection electrodes 263 on the second chip and are respectively joined to internal connection pads 268 on a carrier board 267 by utilizing the assembly method according to the present invention. The internal connection pads are formed by plating Cu pattern with Ni/Au. The height of the connection part between the second chip and the board, since the first chip is held in the inside thereof, needs to be made higher than the first chip. In the figure, it is assumed that the thickness of the first chip is 60 μm, the height of the connection between the chips is 10 μm, the thickness of the Cu pattern of the board is 70 μm, and the thickness of the Au bump is 40 μm. The space defined between the second chip and the board is filled with the second under fill resin 272. Pads 269 for the external connection are formed on the lower side of the carrier board, and the solder bumps 201 are loaded thereon.

According to the present embodiment, the chip and the chip are arranged in such a way as to face each other to be connected at the shortest distance, and with respect to the number of connection pins, the Au bumps are shrunk, whereby the multipin connection becomes possible with the density of 100 pins/mm² or more. Therefore, even the chips which were manufactured through the different processes are laminated as shown in the figure, whereby the signal transmission characteristics at the same level as that in the one chip assembly are ensured, and hence the system LSI can be constructed at the package level. In this case, only the non-defective chips in both sides may be employed, and hence as compared with the method of constructing the system LSI at the wafer level, the manufacture yield of the non-defective chips can be greatly improved.

(Eighteenth Embodiment)

Figure 28:
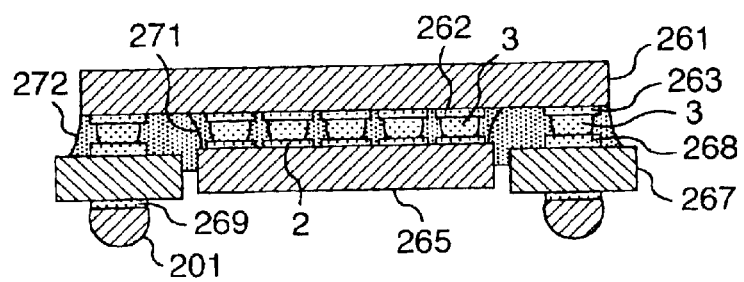
FIG. 28 is a schematic view useful in explaining another embodiment of a lamination type multichip package having the flip chip assembly structure according to the present invention.

FIG. 28 shows another embodiment of the package cross sectional structure when the flip chip assembly structure of the present invention is applied to the multichip package of a lamination type. While the chip lamination structure is the same as that of FIG. 27, a point of difference therefrom is that an opening part which has the size larger than that of the first chip 265 is formed in the carrier board 267, and the first chip is inserted into the board. The assembly mounting method includes: the process of plating the most upper surface of the chip electrode connection pads of the carrier board having the opening formed at the center thereof and the solder ball loading lands with Au; the process of forming the Au projection bumps on the connection electrodes of the second chip; the process of aligning the connection electrodes of the first chip and the Au bumps of the second chip with each other to carry out the loading; the process of applying the heat, the pressure and the ultrasonic wave vibration from the rear face of the chip to join metallically the connection electrodes and the Au bumps to each other to connect electrically them; the process of aligning the connection pads of the carrier board with the Au bumps of the second chip to carry out the loading; the process of applying the heat, the pressure and the ultrasonic wave vibration from the chip side; the process of filling the space defined between the chip and the board and the space between the chips with the liquid resin containing the fillers each showing the low thermal expansion; and the process of heating and curing the resin thus filled.

According to the present embodiment, the multichip package having the two-steps lamination structure can be mounted through the flip chip joining of the Au bumps using the chip having the same thickness as that of the conventional one, and the thickness of the package can be made the same thickness as that of the conventional single chip package. Thus, there is offered the effect that the compaction of the electronic apparatus can be realized. In addition, since the rear face of each of the chips is exposed to the outside, even if each of the chips shows the high calorification, the package which is free from the problem in terms of the heat can be constructed while maintaining the excellent heat radiation property.

(Nineteenth Embodiment)

Figure 29:
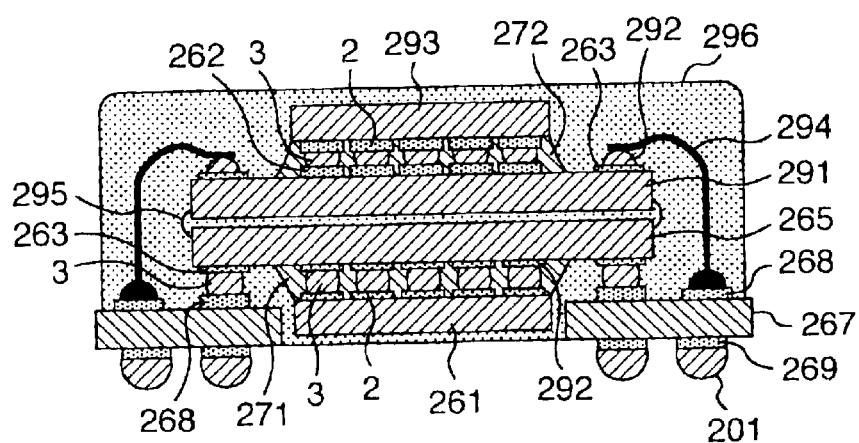
FIG. 29 is a schematic view useful in explaining still another embodiment of a lamination type multichip package having the flip chip assembly structure according to the present invention.

FIG. 29 shows an embodiment of the package cross sectional structure when the flip chip assembly structure of the present invention is applied to the four-steps multichip package. In the figure, the first chip 265 and the second chip 261, and a third chip 291 and a fourth chip 293 are joined to each other by utilizing the flip chip assembly method, according to the present invention, employing the Au bumps 3. The carrier board 267 and the first chip are connected to each other through the ultrasonic wave flip chip joining employing the Au bumps 3. After having loaded the first chip on the board, the rear face of the third chip is made face the rear face of the first chip to bond firmly the third chip to the first chip by the adhesive agent. Au bumps 292 which has been subjected to the flattening processing are respectively formed on the external connection electrodes 263 of the third chip. The internal connection pads 268 of the carrier board and these Au bumps 292 are connected to each other through Au bonding wires 294 by utilizing the reverse Au wire bonding method. An opening part through which the second chip can be embedded is formed at the center of the carrier board, and one side of the board is molded with resin 296 in such a way that the whole chip is covered therewith. On the opposite side of the board, the pads 269 for the external connection are formed and the solder bumps 201 are further formed thereon.

According to the present embodiment, the one-side mold type multichip BGA package having the four steps lamination can be constructed in the same area size as that of the single chip package, and hence it is possible to provide the package which is suitable for the high density assembly. In addition, the thickness of the package can also be held at the thickness or so with which the four chips and the carrier board are piled. Thus, the assembly can be made very compactly in terms of the thickness.

(Twentieth Embodiment)

As another embodiment, in the case where the first and third chips shown in FIG. 29 show the large calorification, a heat radiation plate which has such size as for a part for the heat radiation to be exposed to the outside is sandwiched between the first and third chips to be bonded therebetween. This heat radiation plate is a Cu plate which has a thickness of 0.2 mm and the surface of which is plated with Ni, and is exposed to the outside in such a way as to project from the area having no wire bonding.

According to the present embodiment, even in the case where the LSI chips each showing the high calorific value are laminated, the cooling performance can be enhanced on the basis of the effect of the provision of the head radiation plate, and hence it becomes possible to operate normally the LSIs in the package. As a result, there is offered the effect that the electronic system including a number of LSIs each showing the large calorific value can be assembled compactly with high integration.

(Twenty-oneth Embodiment)

Figure 30:
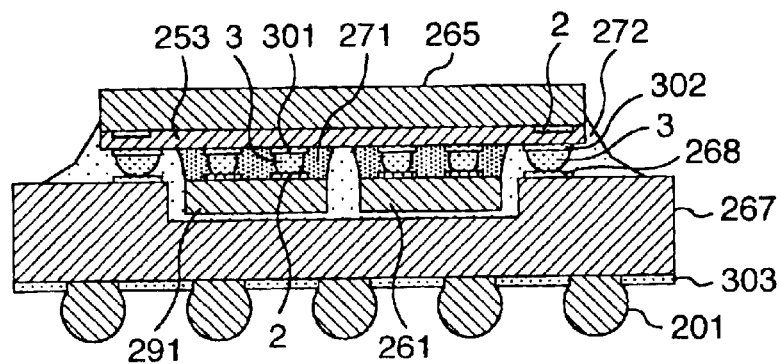
FIG. 30 is a schematic view useful in explaining yet another embodiment of a lamination type multichip package having the flip chip assembly structure according to the present invention.

FIG. 30 shows an embodiment of the package cross sectional structure when the flip chip assembly structure of the present invention is applied to a two-steps lamination type multichip package including three or more chips. In the figure, the first chip 265 is the chip which is assembled by utilizing the wafer process package (WPP) method, and the rewiring layer including polyimide and the Cu wiring is formed on the surface thereof. Then, the structure of the peripheral chip electrodes 2 of the LSI chip are converted into the rearranged electrodes 301 and 302 which have the area-like arrangement. In addition, with respect to the material of the rearranged electrodes, the most upper surface is made of Au irrespective of the material of the chip electrodes, The first chip, and the second and third chips are joined to each other by utilizing the assembly method, according to the present invention, employing the Au bumps 3. In addition, the first chip and the carrier board 267 are electrically connected to each other through the ultrasonic wave flip chip joining employing the Au bumps 3 similarly to the joining between the chips. With respect to the joining between the chip and the board, since the irregularities of the internal structure is remarkable, the resin sheet batch joining is not carried out, but the resin filling is carried out on the basis of the method of injecting the liquid resin later. The size of the cavity is selected somewhat large, whereby the problems of the resin filling, i.e., the problems of the filling property of the resin having the large filler containing rate and the generation of the voids are solved. In FIG. 30, reference numeral 303 designates a solder resist film.

According to the present embodiment, similarly to the case of FIG. 27, the system LSI can be constructed at the package level, the yield can be improved and hence it is possible to provide the system LSI package of low cost.

(Twenty-twoth Embodiment)

Figure 31:
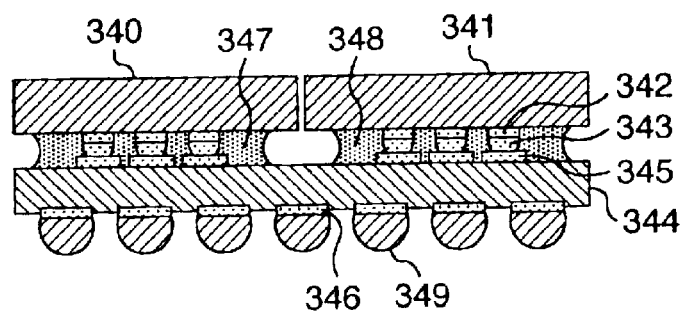
FIG. 31 is a schematic view useful in explaining a further embodiment of a lamination type multichip package having the flip chip assembly structure according to the present invention.

FIG. 31 shows another embodiment of the cross sectional structure of a multichip module employing an organic board according to the present invention. In the figure, Au bumps 343 are respectively formed on Al electrodes 342 on the surfaces of LSI chips 340 and 341 by utilizing the ball bonding method or the plating method. An organic module board 344 is made of glass epoxy resin, and pads 343 for the internal connection are formed on the face on the chip side, while pads 346 for the external connection are formed on the face on the opposite side. Sn-based solder bumps 349 are respectively formed on the pads for the external connection. Each of the pads for the internal connection has the structure in which the Cu core is plated with Ni/Au, and the Au bumps of the chip are metallically connected thereto. The space defined between the chips and the board is filled with thermosetting under fill resin 347 and 348 containing the minute spheroidal fillers each having the low thermal expansion. The under fill resin filling area is formed in such a way as to be smaller than the chip size. The end face of the resin is formed in such a way as to be more outside than the end face of the chip and also to be more outside than the bumps at the most outer periphery. The LSI chips 340 and 341 are arranged in such a way as to hold the narrow gap of about 0.05 to about 2 mm, and the board size has the size equal to the size defined by the envelopes linking the most peripheral sides of the arranged chips.

According to the present embodiment, the under fill resin between the chips is cut off, and also the chips can be mounted so as to be close to each other. Therefore, the stress which is generated due to the thermal deformation of the under fill resin itself can be reduced, and hence it is possible to provide the compact semiconductor module in which the reliability of the joining part is high and the mounting density is increased.

(Twenty-threeth Embodiment)

Figure 32:
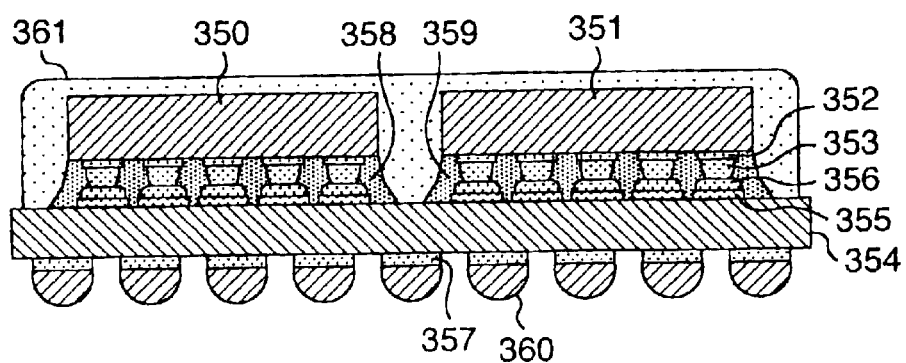
FIG. 32 is a schematic view useful in explaining an even further embodiment of a lamination type multichip package having the flip chip assembly structure according to the present invention.

FIG. 32 shows another embodiment of the cross sectional structure of the multichip module employing an organic board according to the present invention. In the figure, Au bumps 356 are respectively formed on Al electrodes 352 on the surfaces of LSI chips 350 and 351 by utilizing the ball bonding method or the plating method. An organic module board 350 is made of glass epoxy resin, and pads 355 for the internal connection are formed on the face on the chip side, while pads 356 for the external connection are formed on the face on the opposite side. Sn-based solder bumps 360 are respectively formed on the pads for the external connection. Each of the pads for the internal connection has the structure in which the Cu core is plated with Ni/Au, and the Au bumps 353 are formed thereon by utilizing the plating method or the ball bonding method. Then, the Au bumps of the board are metallically joined to those of the chips, respectively. The space defined between the chips and the board is filled with thermosetting under fill resin 358 and 359 containing the minute spheroidal fillers each showing the low thermal expansion, and one side, on the chip mounting side, of the module board is molded with resin 361 in such a way as to cover the whole surface thereof.

According to the present embodiment, since the Au bumps of the board and the Au bumps of the chips are joined to each other, the joining property can be improved, and the output level of the ultrasonic wave required for the joining can be reduced and hence the chip damage can be reduced. In addition, the gap defined between the chips and the board can be made wide, the stress which is generated in the Au bump joining part due to the thermal strain can be reduced and also the compressive force can be applied to the Au bump parts at all times on the basis of the contraction effect of the molded resin. Therefore, there is the advantage that the temperature cycle life can be greatly lengthened.

While the present invention has been particularly shown and described with reference to the preferred embodiments, it will be understood that the various changes and modification will occur to those skilled in the art without departing from the scope and true spirit of the invention. The scope of the invention is therefore to be determined solely by the appended claims.

With respect to the above description, the following items (1) to (9) and (14) to (16) are further disclosed herein.

(1) Flip chip assembly structure comprising:
a semiconductor chip having a circuit for processing electrical signals;
electrodes provided on said semiconductor chip;
bumps which are respectively formed on said electrodes;
internal connection terminals through which the electrical signal is fetched via the associated ones of said bumps from the associated ones of said electrodes; and
a printed circuit board having said internal connection terminals provided thereon,
wherein a semi-cured resin sheet which is softened by the application of the heat is inserted into a space defined between said semiconductor chip and said printed circuit board, and said bumps and said internal connection terminals are metallically joined to each other by the application of the load, the heat and the ultrasonic wave vibration.

(2) Flip chip assembly structure according to the item (1), wherein each of said bumps is made of precious metal.

(3) Flip chip assembly structure according to the item (2), wherein said precious metal is Au.

(4) Flip chip assembly structure according to the item (1), (2) or (3), wherein a melting point of the metal material constituting the joining part which is obtained by the metallic joining is equal to or higher than 275° C. and/or said resin sheet which is inserted into the space defined between said semiconductor chip and said printed circuit board contains 50 vol % or more inorganic fillers.

(5) Flip chip assembly structure comprising:
a semiconductor chip having a circuit for processing electrical signals;
electrodes provided on said semiconductor chip;
precious metal bumps which are respectively formed on said electrodes;
internal connection terminals through which the electrical signal is fetched via the associated ones of said bumps from the associated ones of said electrodes; and
a printed circuit board having said internal connection terminals provided thereon,
wherein said precious metal bumps and precious metal films of said internal connection terminals are electrically connected through the metallic joining, and a space defined between said semiconductor chip and said printed circuit board has resin containing 50 vol % inorganic fillers.

(6) Flip chip assembly structure comprising:
a semiconductor chip having a circuit for processing electrical signals;
electrodes provided on said semiconductor chip;
bumps which are respectively formed on said electrodes;
internal connection terminals through which the electrical signal is fetched via the associated ones of said bumps from the associated ones of said electrodes; and
a printed circuit board having said internal connection terminals provided thereon,
wherein said electrodes and said internal connection terminals are electrically connected to each other through said precious metal bumps, respectively, the electrical resistance of each of the connection parts is in the range of 0.1 to 10 m$\Omega$, and a space defined between said semiconductor chip and said printed circuit board has resin containing 50 vol % inorganic fillers.

(7) Flip chip assembly structure, wherein metal electrodes of a semiconductor chip and internal connection terminals of a printed circuit board are electrically connected to each other through precious metal bumps, respectively, by the metallic joining, a melting point of a metal material constituting each of the connection parts is equal to or higher than 275° C., and a space defined between said semiconductor chip and said printed circuit board has resin containing 50 vol % inorganic fillers.

(8) Flip chip assembly structure according to any one of the items (1) to (7), wherein the particle size of said inorganic fillers is equal to or smaller than ⅓ of the bump height after completion of the compression joining.

(9) Flip chip assembly structure according to any one of the items (1) to (8), wherein the thermal expansion coefficient of each of said inorganic fillers is lower than that of said organic resin.

(14) A method of loading a semiconductor chip on a printed circuit board in a face down manner, a flip chip assembly method comprising: the process of forming precious metal bumps on electrodes of said semiconductor chip; the process of placing a semi-cured resin sheet containing 50 vol % or more inorganic fillers on a predetermined position on said printed circuit board to load thereon said semiconductor chip with said precious metal bumps aligned with internal connection terminals of said printed circuit board; and the process of after having applied from the rear face side of said semiconductor chip, the heat, the load and the ultrasonic wave by a joining tool to push said precious metal bumps into said resin sheet and processing said precious metal bumps thereagainst to join compressively said precious metal bumps to a precious metal film formed on said internal connection terminals, carrying out the heating processing to cure said resin sheet.

(15) A method of loading a semiconductor chip on a printed circuit board in a face down manner, a flip chip assembly method comprising: the process of forming precious metal bumps on electrodes of said semiconductor chip; the process of placing a plurality sheets of semi-cured resin sheets having different containing rates of inorganic fillers on a predetermined position on said printed circuit board to load thereon said semiconductor chip with said precious metal bumps aligned with internal connection terminals of said printed circuit board; and the process of after having applied from the rear face side of said semiconductor chip, the heat, the load and the ultrasonic wave by a joining tool to push said precious metal bumps into said resin sheet and processing said precious metal bumps thereagainst to join compressively said precious metal bumps to a precious metal film formed on said internal connection terminals, carrying out the heating processing to cure said resin sheet.

(16) For use in flip chip assembly structure according to the item (14) or (15), a flip chip assembly method wherein each of said inorganic fillers has a spheroidal shape, and the particle size of said fillers is selected in such a way as to become equal to or smaller than ⅓ of the bump height after completion of the compression joining.

What is claimed is:
1. Flip chip assembly structure comprising:
a semiconductor chip having a circuit for processing electrical signals; electrodes provided on said semiconductor chip;
bumps which are respectively formed on said electrodes;

internal connection terminals through which the electrical signal is fetched via the associated ones of said bumps from the associated ones of said electrodes; and a printed circuit board having said internal connection terminals provided thereon, wherein said bumps each have a stepped projection shape in which a step adjacent to a corresponding one of said internal connection terminals has a diameter which is one half or less the diameter of a step adjacent a corresponding one of said electrodes, wherein said stepped projection shape of each of said bumps is a two step projection shape, wherein a semi-cured resin sheet which is softened by the application of heat is inserted into a space defined between said semiconductor chip and said printed circuit board, and said bumps and said internal connection terminals are metallically joined to each other by the application of a load, the heat and ultrasonic wave vibration to press the bumps through said softened resin sheet to be metallically joined with said internal connection terminals.

2. Flip chip assembly structure according to claim 1, wherein each of said bumps is made of precious metal.

3. Flip chip assembly structure according to claim 2, wherein said precious metal is Au.

4. Flip chip assembly structure according to claim 1, wherein said bumps and said internal connection terminals are metallically joined to each other by connection portions, wherein each said connection portions is comprised of an alloy of the precious metal bumps which have a melting point of 275° C. or greater and a metal or alloy having a melting point of 250° C. or less and/or said semi-cured resin sheet which is inserted into the space defined between said semiconductor chip and said printed circuit board contains 50 vol % or more inorganic fillers.

5. Flip chip assembly structure comprising:

a semiconductor chip having a circuit for processing electrical signals;

electrodes provided on said semiconductor chip;

precious metal bumps which are respectively formed on said electrodes;

internal connection terminals through which the electrical signal is fetched via the associated ones of said bumps from the associated ones of said electrodes; and a printed circuit board having said internal connection terminals provided thereon, wherein said bumps each have a stepped protection shape in which a step adjacent to a corresponding one of said internal connection terminals has a diameter which is one half or less the diameter of a step adjacent a corresponding one of said electrodes, wherein said stepped projection shape of each of said bumps is a two step projection shape, wherein said precious metal bumps and precious metal films of said internal connection terminals are electrically connected through the metallic joining, and a space defined between said semiconductor chip and said printed circuit board has resin containing 50 vol % or more inorganic filters, wherein said precious metal bumps extend through said resin to be electrically connected with said internal connection terminals.

6. Flip chip assembly structure according claim 5, wherein the particle size of said inorganic fillers is equal to or smaller than ⅓ of the bump height after completion of the compression joining.

7. Flip chip assembly structure according claims 5, wherein the coefficient of thermal expansion of each of said inorganic fillers is lower than that of said resin.

8. Flip chip assembly structure comprising:

a semiconductor chip having a circuit for processing electrical signals;

electrodes provided on said semiconductor chip;

bumps which are respectively formed on said electrodes;

internal connection terminals through which the electrical signal is fetched via the associated ones of said bumps from the associated ones of said electrodes; and a printed circuit board having said internal connection terminals provided thereon, wherein said bumps each have a stepped projection shape in which a step adjacent to a corresponding one of said internal connection terminals has a diameter which is one half or less the diameter of a step adjacent a corresponding one of said electrodes, wherein said stepped projection shape of each of said bumps is a two step projection shape, wherein said electrodes and said internal connection terminals are electrically connected to each other through said metal bumps, respectively, the electrical resistance of the connection parts is in the range of 0.1 to 10 mci, and a space defined between said semiconductor chip and said printed circuit board has resin containing 50 vol % or more inorganic fillers, wherein said bumps extend through said resin to be electrically connected with said internal connection terminals.

9. Flip chip assembly structure, wherein metal electrodes of a semiconductor chip and internal connection terminals of a printed circuit board are electrically connected to each other through precious metal bumps, respectively, by the metallic joining to form a connection portions, wherein each said connection portion is comprised of an alloy of the precious metal bumps which have a melting point of 275° C. or greater and a metal or alloy having a melting point of 250° C. or less, and a space defined between said semiconductor chip and said printed circuit board has resin containing 50 vol % or more inorganic fillers, wherein said precious metal bumps each have a stepped projection shape in which a step adjacent to a corresponding one of said internal connection terminals has a diameter which is one half or less the diameter of a step adjacent to a corresponding one of said metal electrodes, wherein said stepped projection shape of each of said precious metal bumps is a two step projection shape.

10. A semiconductor package in which a semiconductor chip is located on a printed circuit board in a face down manner, said package being characterized in that bumps made of precious metal which are respectively formed on electrodes of said semiconductor chip are metallically joined to a precious metal film which is formed on internal connection terminals of said printed circuit board, a space defined between said semiconductor chip and said printed circuit board is filled with resin containing 50 vol % or more inorganic fillers, and the rear face of said printed circuit board on which said semiconductor chip is not mounted has external connection terminals, wherein said bumps each have a stepped projection shape in which a step adjacent to a corresponding one of said internal connection terminals has a diameter which is one half or less the diameter of a step adjacent a corresponding one of said electrodes, wherein said stepped projection shape of each of said bumps is a two step projection shape, wherein said bumps extend through said resin to be electrically connected with said internal connection terminals.

11. A semiconductor package according to claim 10, wherein the material of said board is glass epoxy resin, and the filler particle size of the resin with which the face, having said semiconductor chip loaded thereon, of said printed circuit board is different from that of the resin with which a space defined between said semiconductor chip and the printed circuit board is filled.

12. A semiconductor module in which a semiconductor chip is loaded on a printed circuit board in a face down manner, and other active components and/or passive components are loaded on said printed circuit board, said module being characterized in that bumps made of precious metal which are respectively formed on electrodes of said semiconductor chip are metallically joined to a precious metal film which is formed on internal connection terminals of said printed circuit board, a space defined between said semiconductor chip and said printed circuit board is filled with resin containing 50 vol % or more inorganic fillers, and the rear face of said printed circuit board which is not electrically connected to said semiconductor chip has external connection terminals, wherein said bumps each have a stepped projection shape in which a step adjacent to a corresponding one of said internal connection terminals has a diameter which is one half or less the diameter of a step adjacent a corresponding one of said electrodes, wherein said stepped projection shape of each of said bumps is a two step projection shape, wherein said bumps extend through said resin to be electrically connected with said internal connection terminals.

* * * * *